(12) United States Patent
Huang et al.

(10) Patent No.: US 11,804,445 B2
(45) Date of Patent: Oct. 31, 2023

(54) METHOD FOR FORMING CHIP PACKAGE STRUCTURE

(71) Applicant: Taiwan Semiconductor Manufacturing Company, Ltd., Hsinchu (TW)

(72) Inventors: Heh-Chang Huang, Hsinchu (TW); Fu-Jen Li, Hsinchu (TW); Pei-Haw Tsao, Tai-chung (TW); Shyue-Ter Leu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 55 days.

(21) Appl. No.: 17/244,754

(22) Filed: Apr. 29, 2021

(65) Prior Publication Data

US 2022/0352083 A1 Nov. 3, 2022

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 21/4853; H01L 21/4857; H01L 21/565; H01L 23/3128; H01L 23/5383; H01L 23/5386; H01L 24/19; H01L 24/20; H01L 2224/214; H01L 23/49816; H01L 23/5385; H01L 2224/16225; H01L 2924/15192;
(Continued)

(56) References Cited

U.S. PATENT DOCUMENTS 8,993,380 B2   3/2015  Hou et al.
9,281,254 B2   3/2016  Yu et al.
(Continued)

FOREIGN PATENT DOCUMENTS

TW   201431039 A   8/2014
TW   202032679 A   9/2020
(Continued)

*Primary Examiner* — Kyoung Lee
*Assistant Examiner* — Christina A Sylvia
(74) *Attorney, Agent, or Firm* — Birch, Stewart, Kolasch & Birch, LLP

(57) ABSTRACT

A chip package structure is provided. The chip package structure includes a first chip structure including a substrate and an interconnect layer over the substrate. The chip package structure includes a second chip structure over the interconnect layer. The chip package structure includes a first conductive bump connected between the interconnect layer and the second chip structure. The chip package structure includes a conductive pillar over the interconnect layer. The chip package structure includes a molding layer over the interconnect layer and surrounding the second chip structure, the first conductive bump, and the conductive pillar. The chip package structure includes a second conductive bump over a first surface of the conductive pillar. The first surface faces away from the first chip structure.

20 Claims, 22 Drawing Sheets

(51) Int. Cl.
  *H01L 21/56* (2006.01)
  *H01L 23/31* (2006.01)
  *H01L 23/00* (2006.01)

(52) U.S. Cl.
  CPC ........ *H01L 21/565* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2224/214* (2013.01)

(58) Field of Classification Search
  CPC ..... H01L 2924/15311; H01L 2924/181; H01L 25/16; H01L 23/481; H01L 23/4824; H01L 23/485; H01L 24/02; H01L 24/11; H01L 24/13; H01L 2224/02331; H01L 2224/02373; H01L 2224/02381; H01L 2224/111; H01L 2224/13008
  See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1* | 10/2016 | Tsai ................. H01L 21/6835 |
| 9,496,189 | B2 | 11/2016 | Yu et al. |
| 9,666,502 | B2 | 5/2017 | Chen et al. |
| 9,735,131 | B2 | 8/2017 | Su et al. |
| 2015/0325556 | A1* | 11/2015 | Lai ................. H01L 23/49811 257/784 |
| 2017/0154878 | A1* | 6/2017 | Kim ..................... H01L 25/50 |
| 2019/0189564 | A1* | 6/2019 | Guzek .................. H01L 21/56 |
| 2020/0113707 | A1* | 4/2020 | Petersheim ........... A61F 2/4455 |

FOREIGN PATENT DOCUMENTS

| | | |
|---|---|---|
| TW | 202107643 A | 2/2021 |
| TW | 202114089 A | 4/2021 |

* cited by examiner

METHOD FOR FORMING CHIP PACKAGE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits (IC) are typically manufactured on a semiconductor wafer. Technological advances in IC materials and design have produced generations of ICs. Each generation has smaller and more complex circuits than the previous generation. The dies of the wafer may be processed and packaged at the wafer level, and various technologies have been developed for wafer level packaging. Since the chip package structure may need to include multiple chips with multiple functions, it is a challenge to reduce a thickness of a chip package structure with multiple chips.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1E-1 is a top view of the chip package structure of FIG. 1E, in accordance with some embodiments.

FIG. 3B-1 is a top view of the chip package structure of FIG. 3B, in accordance with some embodiments.

DETAILED DESCRIPTION

Figure 1A:
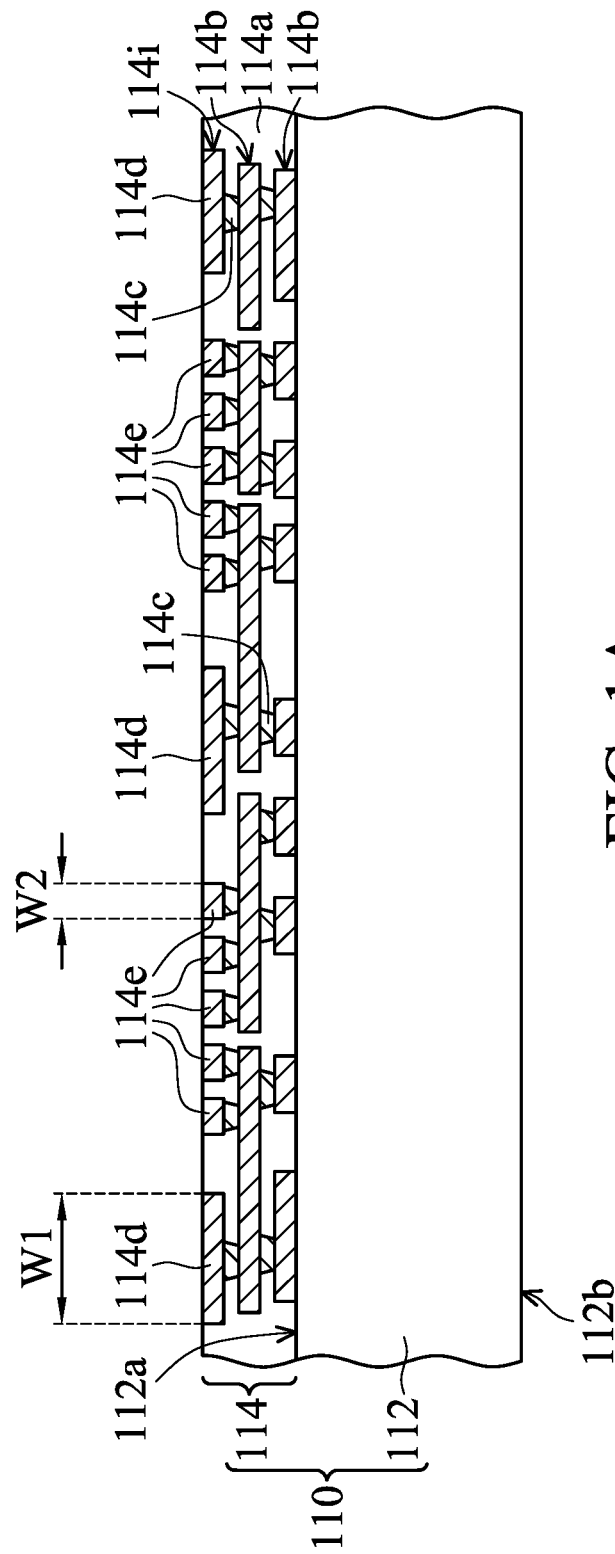
FIGS. 1A-1G are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are cross-sectional views of various stages of a process for forming a chip package structure, in accordance with some embodiments. As shown in FIG. 1A, a semiconductor structure 110 is provided, in accordance with some embodiments. The semiconductor structure 110 includes a substrate 112 and an interconnect layer 114, in accordance with some embodiments.

The substrate 112 is also referred to as a semiconductor substrate, a wafer, or the like, including interconnecting structures and electronic elements, such as transistors and/or memories, in accordance with some embodiments. In some embodiments, the substrate 112 includes at least an elementary semiconductor material including silicon or germanium in a single crystal, polycrystal, or amorphous structure.

In some other embodiments, the substrate 112 includes a compound semiconductor, such as silicon carbide, gallium arsenide, gallium phosphide, indium phosphide, indium arsenide, an alloy semiconductor, such as SiGe or GaAsP, or a combination thereof. The substrate 112 may also include multi-layer semiconductors, semiconductor on insulator (SOI) (such as silicon on insulator or germanium on insulator), or a combination thereof.

The substrate 112 has a front surface 112a and a back surface 112b opposite to the front surface 112a, in accordance with some embodiments. In some embodiments, electronic elements (not shown) are formed on the front surface 112a or in the substrate 112 adjacent to the front surface 112a. The electronic elements include active elements (e.g. transistors, diodes, or the like) and/or passive elements (e.g. resistors, capacitors, inductors, or the like).

In some embodiments, the active elements and the passive elements are not formed on the back surface 112b or in the substrate 112 adjacent to the back surface 112b. That is, there is no active element and no passive element formed directly on the back surface 112b or in the substrate 112 adjacent to the back surface 112b. In some other embodiments, the active elements and the passive elements are formed on the back surface 112b or in the substrate 112 adjacent to the back surface 112b.

The interconnect layer 114 is formed over the front surface 112a of the substrate 112, covers the electronic elements, and refers to a redistribution layer (RDL), in accordance with some embodiments. The interconnect layer 114 includes a dielectric layer 114a and an interconnect structure 114i, in accordance with some embodiments. The interconnect structure 114i is in the dielectric layer 114a, in accordance with some embodiments.

The interconnect structure 114i includes wiring layers 114b, conductive vias 114c, and conductive pads 114d and 114e, in accordance with some embodiments. In some embodiments, a dielectric layer (not shown) is between the bottommost wiring layer 114b and the substrate 112. The conductive vias 114c are electrically connected between different wiring layers 114b, in accordance with some embodiments.

The conductive vias 114c are electrically connected between the wiring layer 114b and the conductive pads 114d and 114e, in accordance with some embodiments. The conductive vias 114c are electrically connected between the wiring layer 114b and the electronic elements, in accordance with some embodiments. In some embodiments, a width W1 of the conductive pad 114d is greater than a width W2 of the conductive pad 114e.

The dielectric layer 114a is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric layer 114a includes a low-k material or a porous dielectric material having a k-value which is lower than that of silicon oxide, or lower than about 3.0 or about 2.5, in accordance with some embodiments.

The dielectric layer 114a is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The wiring layers 114b, the conductive vias 114c, and the conductive pads 114d and 114e are made of a conductive material, such as metal (e.g., aluminum, copper, silver, gold, nickel, or tungsten) or alloys thereof, in accordance with some embodiments.

Figure 1B:
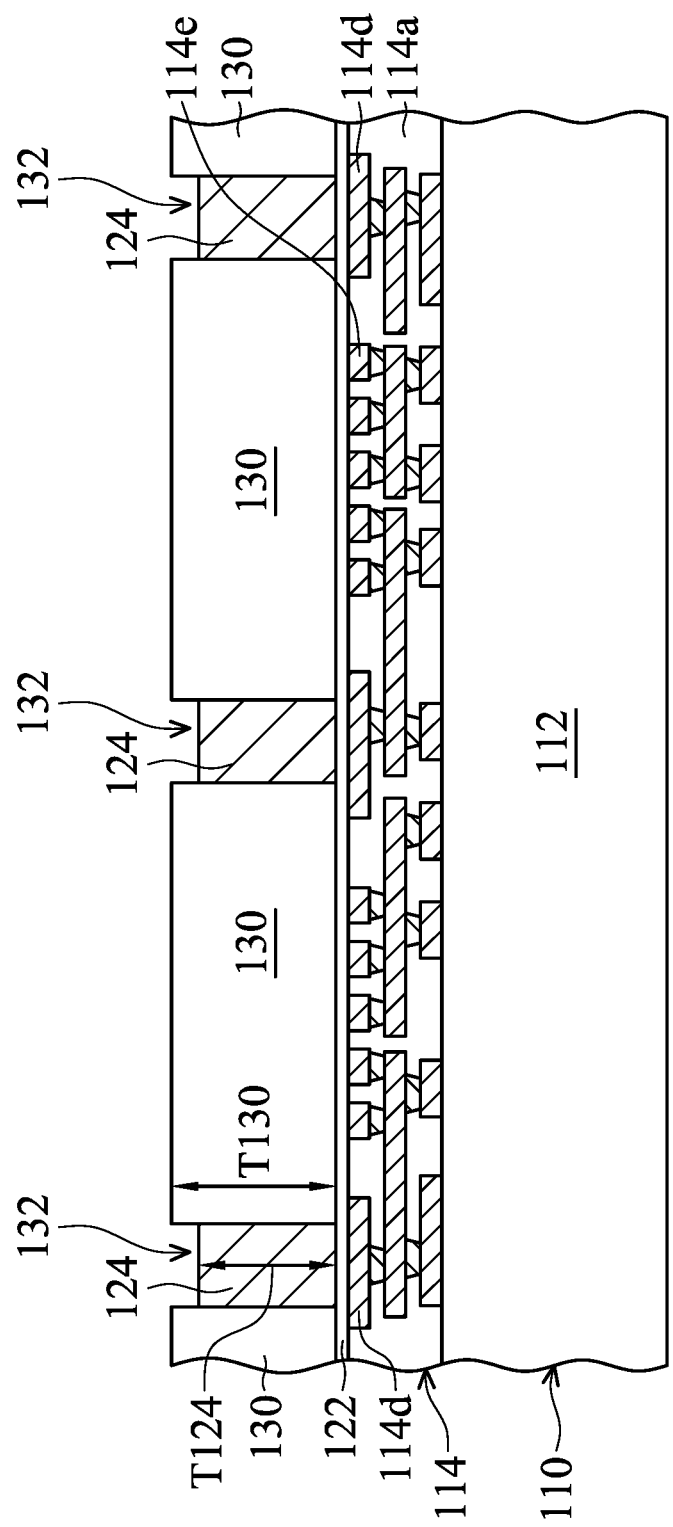

As shown in FIG. 1B, a seed layer 122 is formed over the interconnect layer 114, in accordance with some embodiments. The seed layer 122 is made of a conductive material, such as metal (e.g., copper, aluminum, gold, silver, or tungsten) or alloys thereof, in accordance with some embodiments. The seed layer 122 is formed using a deposition process, such as a physical vapor deposition process or a chemical vapor deposition process, in accordance with some embodiments.

As shown in FIG. 1B, a mask layer 130 is formed over the seed layer 122, in accordance with some embodiments. The mask layer 130 has openings 132 over the conductive pads 114d, in accordance with some embodiments. The openings 132 expose portions of the seed layer 122 over the conductive pads 114d, in accordance with some embodiments. The mask layer 130 is made of a polymer material, such as a photoresist material, in accordance with some embodiments.

As shown in FIG. 1B, a conductive layer 124 is formed in the openings 132 of the mask layer 130, in accordance with some embodiments. In some embodiments, a thickness T124 of the conductive layer 124 is less than a thickness T130 of the mask layer 130. The conductive layer 124 is made of a conductive material, such as metal (e.g., copper, aluminum, gold, silver, or tungsten) or alloys thereof, in accordance with some embodiments. The conductive layer 124 is formed using a plating process, such as an electroplating process, in accordance with some embodiments.

Figure 1C:
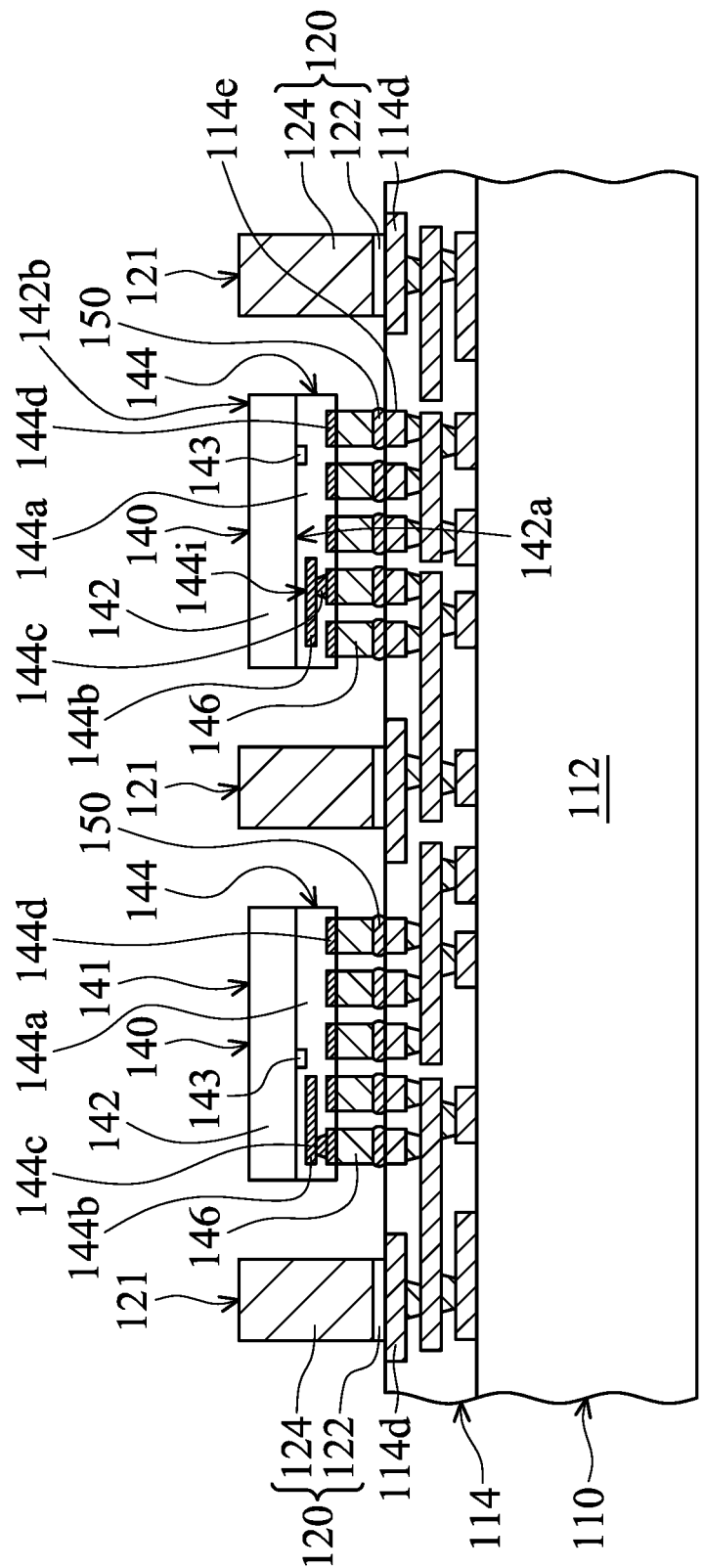

As shown in FIG. 1C, the mask layer 130 and the seed layer 122 under the mask layer 130 are removed, in accordance with some embodiments. The conductive layer 124 and the seed layer 122 remaining under the conductive layer 124 together form conductive pillars 120, in accordance with some embodiments. The conductive pillars 120 are respectively formed over the conductive pads 114d, in accordance with some embodiments.

As shown in FIG. 1C, chip structures 140 are bonded to the conductive pads 114e of the interconnect layer 114 through conductive bumps 150, in accordance with some embodiments. In some embodiments, a top surface 141 of each chip structure 140 is lower than a top surface 121 of each conductive pillar 120.

Each chip structure 140 includes a substrate 142, electronic elements 143, an interconnect layer 144, and conductive pillars 146, in accordance with some embodiments. In some embodiments, the chip structures 140 include passive chips including passive devices, such as inductors, capacitors, resistors, or the like. The passive chips are also referred to as passive dies, in accordance with some embodiments. In some other embodiments, the chip structures 140 include radio frequency (RF) chips, power chips, central processing unit (CPU) chips, or the like.

The substrate 142 is also referred to as a semiconductor substrate, in accordance with some embodiments. In some embodiments, the substrate 142 is made of at least an elementary semiconductor material including silicon or germanium in a single crystal, polycrystal, or amorphous structure.

In some other embodiments, the substrate 142 is made of a compound semiconductor, such as silicon carbide, gallium arsenide, gallium phosphide, indium phosphide, indium arsenide, an alloy semiconductor, such as SiGe or GaAsP, or a combination thereof. The substrate 142 may also include multi-layer semiconductors, semiconductor on insulator (SOI) (such as silicon on insulator or germanium on insulator), or a combination thereof.

The substrate 142 has a front surface 142a and a back surface 142b opposite to the front surface 142a, in accordance with some embodiments. In some embodiments, the electronic elements 143 are formed on the front surface 142a or in the substrate 142 adjacent to the front surface 142a. The electronic elements 143 include active elements (e.g. transistors, diodes, or the like) and/or passive elements (e.g. resistors, capacitors, inductors, or the like).

In some embodiments, the active elements and the passive elements are not formed on the back surface 142b or in the substrate 142 adjacent to the back surface 142b. That is, there is no active element and no passive element formed directly on the back surface 142b or in the substrate 142 adjacent to the back surface 142b. In some other embodiments, the active elements and the passive elements are formed on the back surface 142b or in the substrate 142 adjacent to the back surface 142b.

The interconnect layer 144 is formed over the front surface 142a of the substrate 142 and covers the electronic elements 143, in accordance with some embodiments. The interconnect layer 144 is between the substrate 142 and the interconnect layer 114, in accordance with some embodiments. The interconnect layer 144 includes a dielectric layer 144a and an interconnect structure 144i, in accordance with some embodiments. The interconnect structure 144i is in the dielectric layer 144a, in accordance with some embodiments.

The interconnect structure 144i includes wiring layers 144b, conductive vias 144c, and conductive pads 144d, in accordance with some embodiments. For the sake of simplicity, FIG. 1C only shows one of the wiring layers 144b, in accordance with some embodiments. The conductive vias 144c are electrically connected between different wiring layers 144b, in accordance with some embodiments.

The conductive vias 144c are electrically connected between the wiring layer 144b and the conductive pads 144d, in accordance with some embodiments. The conductive vias 144c are electrically connected between the wiring layer 144b and the electronic elements 143, in accordance with some embodiments.

The dielectric layer 144a is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric layer 144a includes a low-k material or a porous dielectric material having a k-value which is lower than that of silicon oxide, or lower than about 3.0 or about 2.5, in accordance with some embodiments.

The dielectric layer 144a is formed using a chemical vapor deposition (CVD) process, such as a low-pressure CVD process, a plasma-enhanced CVD process, or a high-density plasma CVD process, an atomic layer deposition process, a spin-on process, a physical vapor deposition process, or another suitable process.

The wiring layers 144b, the conductive vias 144c, and the conductive pads 144d are made of a conductive material, such as metal (e.g., aluminum, copper, silver, gold, nickel, or tungsten) or alloys thereof, in accordance with some embodiments.

The conductive pillars 146 are respectively formed over the conductive pads 144d, in accordance with some embodiments. The conductive pillars 146 are made of a conductive material, such as metal (e.g., aluminum, copper, silver, gold, nickel, or tungsten) or alloys thereof, in accordance with some embodiments. The conductive pillars 146 are formed using a plating process, such as an electroplating process, in accordance with some embodiments.

The conductive bumps 150 are connected between the conductive pillars 146 of the chip structure 140 and the conductive pads 114e of the interconnect layer 114, in accordance with some embodiments. The conductive bumps 150 are made of a conductive material, such as a tin-based alloy, in accordance with some embodiments.

Figure 1D:
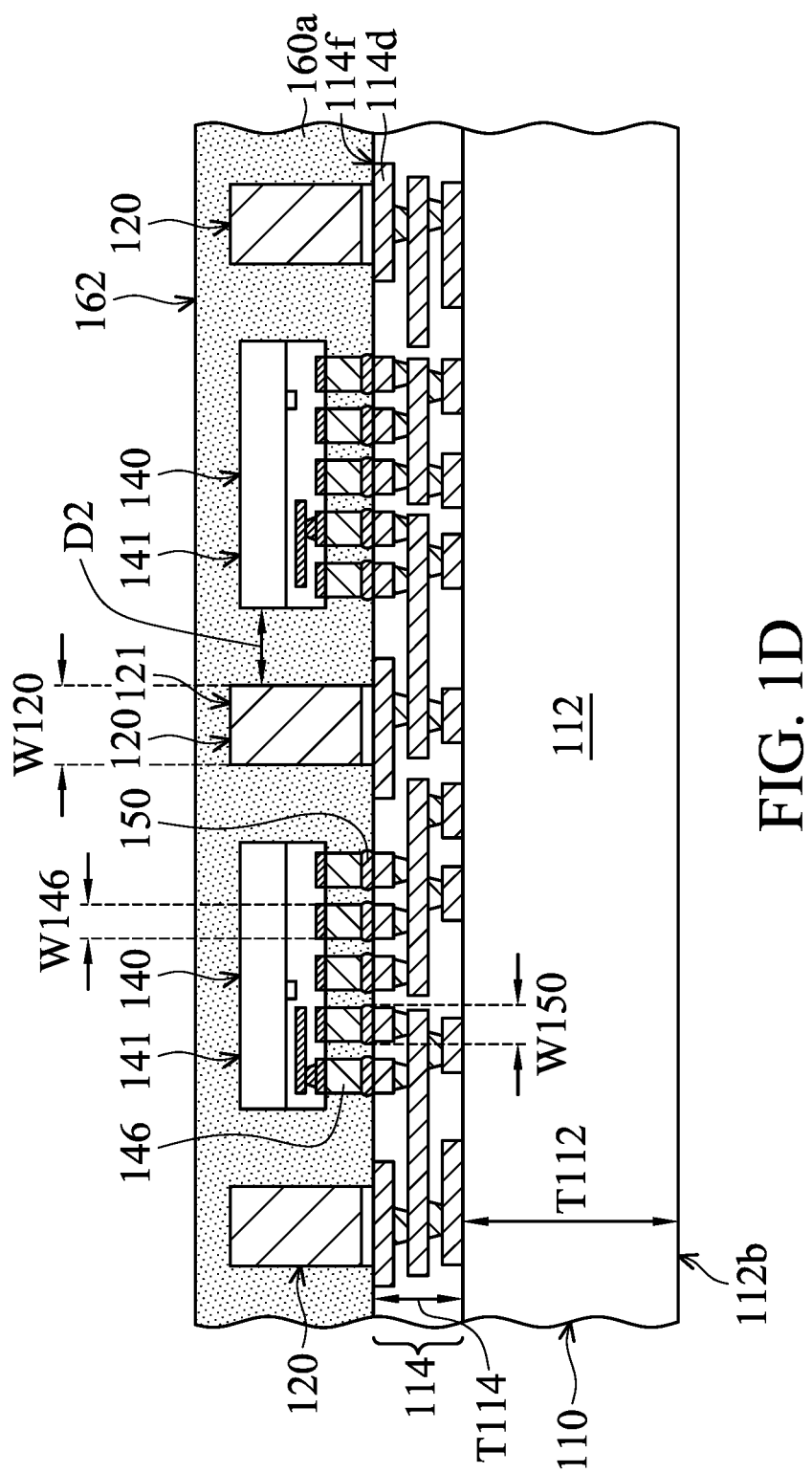

As shown in FIG. 1D, a molding material layer 160a is formed over the interconnect layer 114, in accordance with some embodiments. The molding material layer 160a covers the chip structures 140, the conductive bumps 150, and the conductive pillars 120, in accordance with some embodiments. The molding material layer 160a surrounds the chip structures 140, the conductive bumps 150, and the conductive pillars 120, in accordance with some embodiments.

The molding material layer 160a is in direct contact with the chip structure 140, the conductive bumps 150, and the conductive pillars 120, in accordance with some embodiments. The molding material layer 160a is made of a polymer material or another suitable insulating material.

As shown in FIG. 1D, a width W120 of the conductive pillars 120 is greater than a width W146 of the conductive pillars 146, in accordance with some embodiments. The width W120 of the conductive pillars 120 is greater than a width W150 of the conductive bumps 150, in accordance with some embodiments. The width W120 ranges from about 30 μm to about 90 μm, in accordance with some embodiments.

If the width W120 is less than 30 μm, the conductive pillars 120 are too thin to sustain the thermal stress in subsequent annealing process and therefore tend to crack, in accordance with some embodiments. If the width W120 is greater than 90 μm, the conductive pillars 120 are too thick, which reduces the number of the conductive pillars 120 per unit area of the surface 114f of the interconnect layer 114, in accordance with some embodiments.

The width W146 of the conductive pillar 146 ranges from about 10 μm to about 30 μm, in accordance with some embodiments. The width W150 of the conductive bump 150 ranges from about 10 μm to about 30 μm, in accordance with some embodiments. In some embodiments, a distance D2 between the chip structure 140 and the conductive pillar 120 adjacent thereto ranges from about 20 μm to about 40 μm, in accordance with some embodiments.

In some embodiments, a thickness T112 of the substrate 112 is greater than a thickness T114 of the interconnect layer 114. The thickness T112 ranges from about 600 μm to about 950 μm, in accordance with some embodiments. The thickness T1.14 ranges from about 5 μm to about 20 μm, in accordance with some embodiments.

Figure 1E:
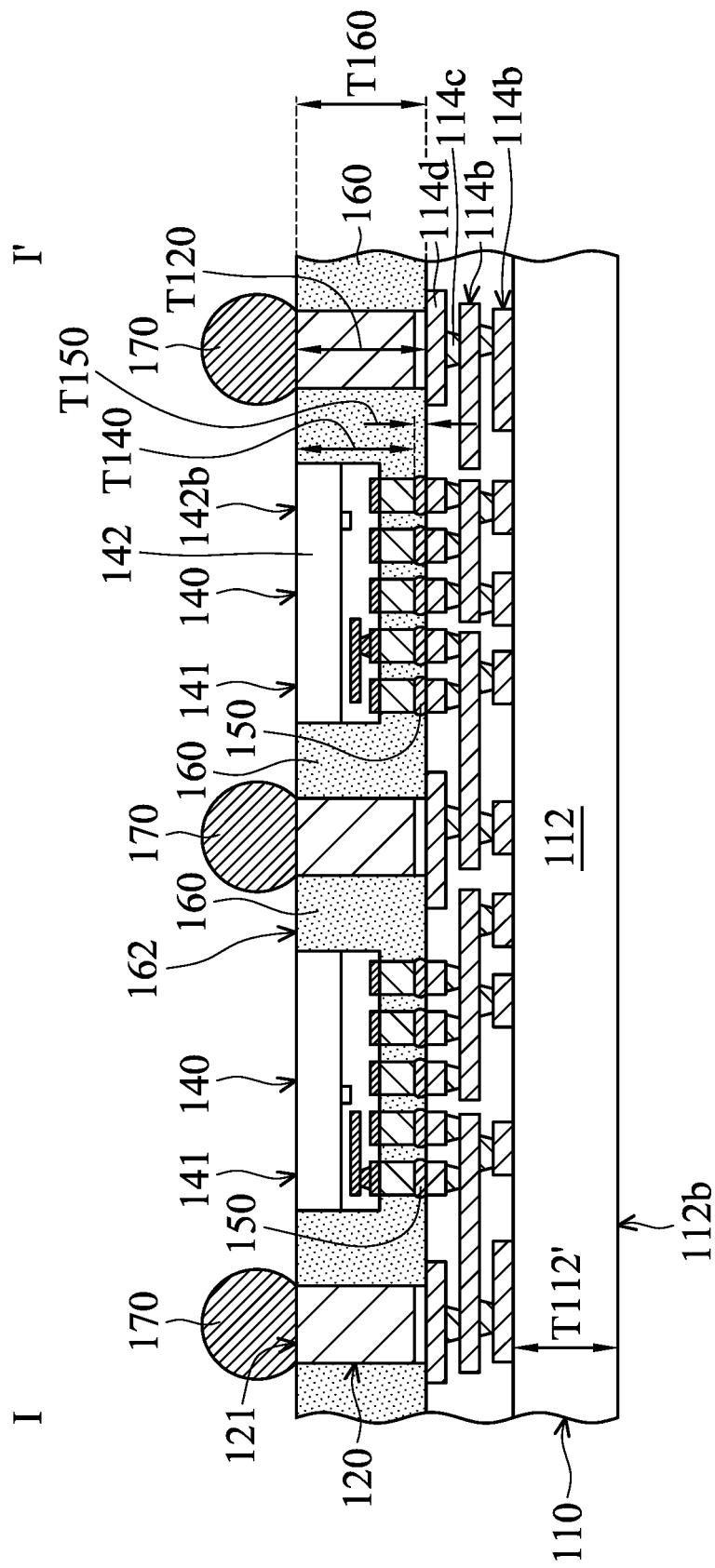

As shown in FIGS. 1D and 1E, the molding material layer 160a over the chip structure 140 and the conductive pillars 120 is removed, in accordance with some embodiments. The remaining molding material layer 160a forms a molding layer 160, in accordance with some embodiments.

The molding layer 160 surrounds the chip structures 140, the conductive bumps 150, and the conductive pillars 120, in accordance with some embodiments. The removal process is performed until the top surfaces 121 and 141 of the conductive pillars 120 and the chip structures 140 are exposed, in accordance with some embodiments.

In some embodiments, top portions of the conductive pillars 120 and the chip structure 140 are also removed during the removal process of the molding material layer 160a, in accordance with some embodiments. For example, the molding material layer 160a, the conductive pillars 120, and the chip structure 140 are thinned from the top surfaces 162, 121, and 141 of the molding material layer 160a, the conductive pillars 120, and the chip structures 140.

After the removal process, the top surfaces 162, 121, and 141 are substantially level with each other, in accordance with some embodiments. The removal process (or the thinning process) of the molding material layer 160a, the conductive pillars 120, and the chip structure 140 includes a grinding process, in accordance with some embodiments.

Since the top surfaces 141 of the chip structures 140 are lower than the top surfaces 121 of the conductive pillars 120 before the removal process (as shown in FIG. 1D), the removed thickness of the chip structures 140 is less than the removed thickness of the conductive pillars 120 when the top surfaces 121 and 141 of all of the conductive pillars 120 and the chip structures 140 are completely exposed (as shown in FIG. 1E), which reduces the damage to the top surfaces 141 of the chip structures 140 (i.e., the back surface 142b of the substrate 142) caused by the removal process, in accordance with some embodiments.

Figures 1, 1E:
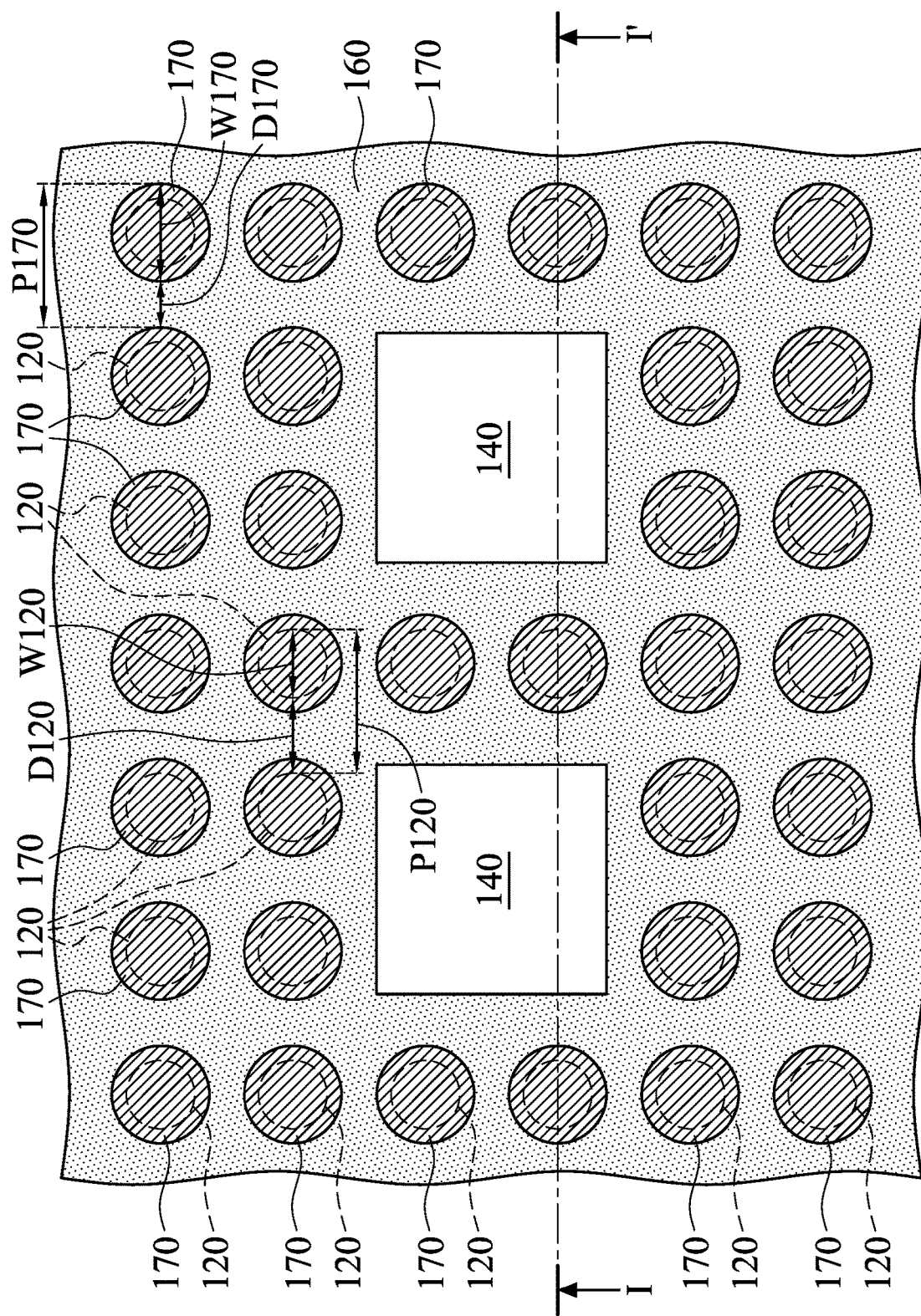

FIG. 1E-1 is a top view of the chip package structure of FIG. 1E, in accordance with some embodiments. FIG. 1E is a cross-sectional view illustrating the chip package structure along a sectional line I-I' in FIG. 1E-1, in accordance with some embodiments.

As shown in FIGS. 1E and 1E-1, conductive bumps 170 are respectively formed over the top surfaces 121 of the conductive pillars 120, in accordance with some embodiments. The conductive bumps 170 are connected to the conductive pillars 120 thereunder, in accordance with some embodiments. The conductive bump 170 is wider than the conductive pillar 120 thereunder, in accordance with some embodiments.

The conductive bumps 170 are made of a conductive material, such as a tin-based alloy, in accordance with some embodiments. The conductive bumps 170 and the conductive pillars 120 are made of different materials, in accordance with some embodiments.

In some embodiments, a melting point of the conductive bumps 170 is lower than a melting point of the conductive pillars 120. The melting point of the conductive bumps 170 ranges from about 190° C. to about 150° C., in accordance with some embodiments. The melting point of the conductive pillars 120 ranges from about 900° C. to about 1100° C., in accordance with some embodiments.

The formation of the conductive bumps 170 includes applying the conductive material over the conductive pillars 120; and annealing the conductive material, in accordance with some embodiments. The conductive material is applied using a plating process (e.g., an electroplating process) or a disposing process, in accordance with some embodiments.

As shown in FIGS. 1D and 1E, a bottom portion of the substrate 112 is removed, in accordance with some embodiments. The thickness T112' of the substrate 112 after the removal process (as shown in FIG. 1E) is less than the thickness T112 of the substrate 112 before the removal process (as shown in FIG. 1D), in accordance with some embodiments.

The thickness T112' ranges from about 30 μm to about 60 μm, in accordance with some embodiments. The removal process includes performing a thinning process over the back surface 112b of the substrate 112, in accordance with some embodiments. The thinning process includes a grinding process, in accordance with some embodiments.

The molding layer 160 is able to provide support to the substrate 112 during the grinding process, which prevents the substrate 112 from being cracked during the grinding process, in accordance with some embodiments. Therefore, the substrate 112 is able to be further thinned, in accordance with some embodiments. As a result, the total thickness of the semiconductor structure 110 and the molding layer 160 is able to be further decreased, in accordance with some embodiments.

In some embodiments, a thickness T120 of the conductive pillar 120 is substantially equal to a sum of a thickness T140 of the chip structure 140 and a thickness T150 of the conductive bump 150. The thickness T120 of the conductive pillar 120 is substantially equal to a thickness T160 of the molding layer 160, in accordance with some embodiments.

The thickness T120 ranges from about 30 μm to about 50 μm, in accordance with some embodiments. The thickness T160 ranges from about 30 μm to about 50 μm, in accordance with some embodiments. If the thickness T160 is less than 30 μm, the molding layer 160 may be too thin to provide sufficient support to the substrate 112 during the grinding process. If the thickness T160 is greater than 50 μm, the molding layer 160 may be too thick, which is not conducive to reduce the total thickness of the semiconductor structure 110 and the molding layer 160.

Figure 1F:
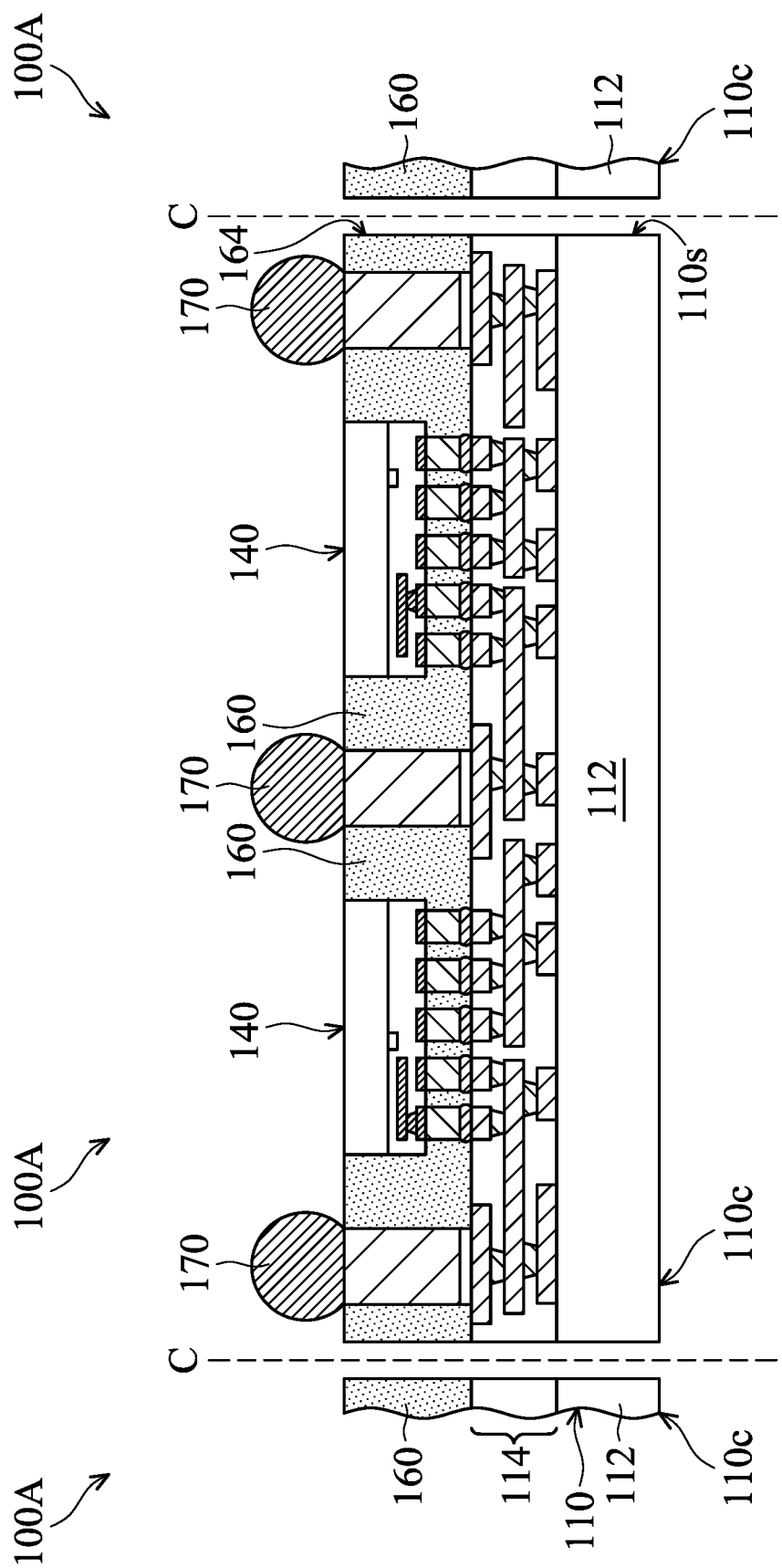

As shown in FIG. 1F, a cutting process is performed to cut through the molding layer 160 and the semiconductor structure 110 along cutting lines C so as to form chip package structures 100A, in accordance with some embodiments. In each chip package structure 100A, the substrate 112 and the interconnect layer 114 thereover together form a chip structure 110c, in accordance with some embodiments.

The chip structure 110c includes a system-on-chip (SoC), a logic chip (or a logic die), a memory chip, a high-performance-computing (HPC) chip, or another suitable chip, in accordance with some embodiments. In some embodiments, a sidewall 164 of the molding layer 160 is substantially level with a sidewall 110s of the chip structure 110c.

Figure 1G:
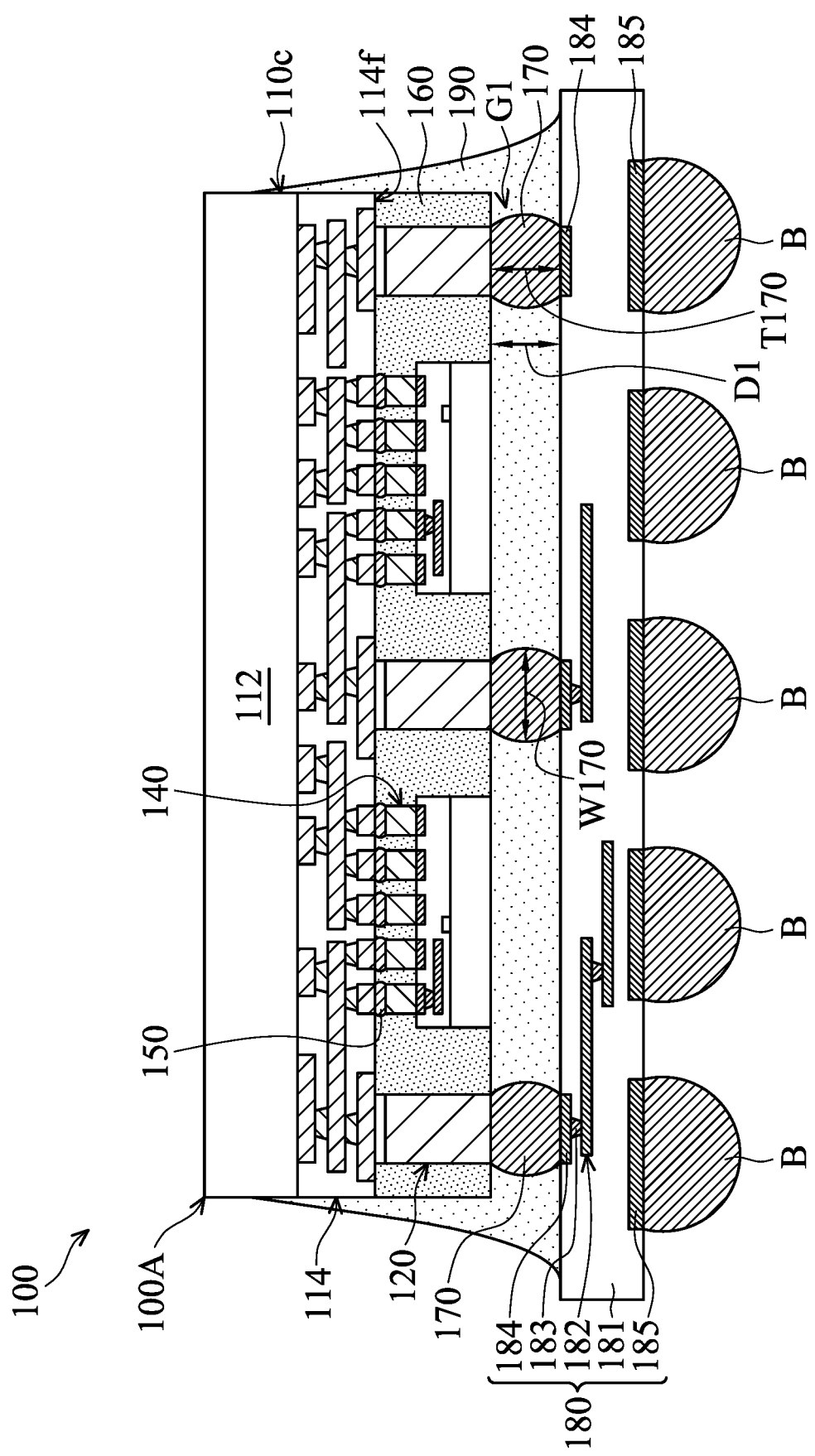

As shown in FIG. 1G, the chip package structure 100A is bonded to a wiring substrate 180 through the conductive bumps 170, in accordance with some embodiments. The conductive bumps 170 are connected between the conductive pillars 120 and the wiring substrate 180, in accordance with some embodiments. The conductive bump 170 has a thickness T170 ranging from about 10 µm to about 20 µm, in accordance with some embodiments.

The wiring substrate 180 includes a printed circuit board (PCB), a chip, or another suitable structure with wiring layers and pads. The wiring substrate 180 includes a dielectric layer 181, wiring layers 182, conductive vias 183, and conductive pads 184 and 185, in accordance with some embodiments. The conductive pads 184 and 185 are formed over the dielectric layer 181, in accordance with some embodiments.

The wiring layers 182 and the conductive vias 183 are formed in the dielectric layer 181, in accordance with some embodiments. The conductive vias 183 are electrically connected between different wiring layers 182, in accordance with some embodiments.

The conductive vias 183 are electrically connected between the wiring layers 182 and the conductive pads 184 and 185, in accordance with some embodiments. The conductive bumps 170 are connected between the conductive pads 184 and the conductive pillars 120, in accordance with some embodiments. The conductive pad 185 is wider than the conductive pad 184, in accordance with some embodiments.

The dielectric layer 181 is made of an insulating material, such as a polymer material, in accordance with some embodiments. The wiring layers 182, the conductive vias 183, and the conductive pads 184 and 185 are made of metal (e.g., copper, aluminum, gold, silver, or tungsten) or alloy thereof, in accordance with some embodiments.

As shown in FIG. 1G, an underfill layer 190 is formed over the wiring substrate 180, in accordance with some embodiments. The underfill layer 190 surrounds the molding layer 160, the chip structures 110c and 140, the conductive pillars 120, and the conductive bumps 150 and 170, in accordance with some embodiments.

The underfill layer 190 is in direct contact with the molding layer 160, the chip structures 110c and 140, and the conductive bumps 170, in accordance with some embodiments. The underfill layer 190 is made of an insulating material, such as a polymer material, in accordance with some embodiments.

As shown in FIG. 1G, conductive bumps B are formed over the conductive pads 185, in accordance with some embodiments. The conductive bumps B are made of a conductive material, such as a tin-based alloy, in accordance with some embodiments. The conductive bump B is wider and thicker than the conductive bump 170, in accordance with some embodiments. In this step, a chip package structure 100 is substantially formed, in accordance with some embodiments.

In some embodiments, a distance D1 between the molding layer 160 (or the chip structure 140) and the wiring substrate 180 ranges from about 10 µm to about 20 µm. If the distance D1 is less than 10 µm, it is not conducive to fill the underfill layer 190 into the gap G1 between the molding layer 160 (or the chip structure 140) and the wiring substrate 180, in accordance with some embodiments. If the distance D1 is greater than 20 µm, it is not conducive to reduce the total thickness of the chip package structure 100, in accordance with some embodiments.

The chip structure 110c is bonded to the wiring substrate 180 not only through the conductive bumps 170 but also through the conductive pillars 120, in accordance with some embodiments. Therefore, the size (e.g., the width W170 and the thickness T170) of the conductive bumps 170 is greatly decreased, in accordance with some embodiments.

Therefore, as shown in FIGS. 1E-1 and 1G, the number of the conductive bumps 170 per unit area of the surface 114f of the interconnect layer 114 (i.e., the number density of the conductive bumps 170) is greatly increased, in accordance with some embodiments. As a result, the efficiency of signal transmission between the chip package structure 100A and the wiring substrate 180 is improved, in accordance with some embodiments. Therefore, the performance of the chip package structure 100 is improved, in accordance with some embodiments.

As shown in FIG. 1E-1, a distance D170 between the two adjacent conductive bumps 170 ranges from about 10 µm to about 60 µm, in accordance with some embodiments. In some embodiments, a pitch P170 of the conductive bumps 170 ranges from about 50 µm to about 100 µm. The pitch P170 is equal to a sum of the distance D170 and a width W170 (or a diameter) of the conductive bump 170, in accordance with some embodiments. Accordingly, the chip package structure 100A achieves a fine pitch bump arrangement, compared with a conventional package having bigger bumps.

As shown in FIG. 1E-1, a distance D120 between the two adjacent conductive pillars 120 ranges from about 20 µm to about 70 µm, in accordance with some embodiments. In some embodiments, a pitch P120 of the conductive pillars 120 ranges from about 50 µm to about 100 µm. The pitch P120 is equal to a sum of the distance D120 and the width W120 (or a diameter) of the conductive pillar 120, in accordance with some embodiments.

As shown in FIG. 1E-1, if the distance D170 is less than 10 µm (or the distance D120 is less than 20 µm), the two adjacent conductive bumps 170 are too close to each other, which tends to cause a short circuit therebetween, in accordance with some embodiments.

As shown in FIGS. 1E-1 and 1G, if the distance D170 is greater than 60 µm (or the distance D120 is greater than 70 µm), the number density of the conductive bumps 170 is too low, which is not conducive to the efficiency of signal transmission between the chip package structure 100A and the wiring substrate 180, in accordance with some embodiments.

The widths W120 and W170 and the distances D120 and D170 are adjustable by adjusting the opening pattern of the mask layer 130 of FIG. 1B and the amount of the conductive material of the conductive bumps 170 applied over the conductive pillars 120 of FIG. 1E, in accordance with some embodiments.

Figure 2A:
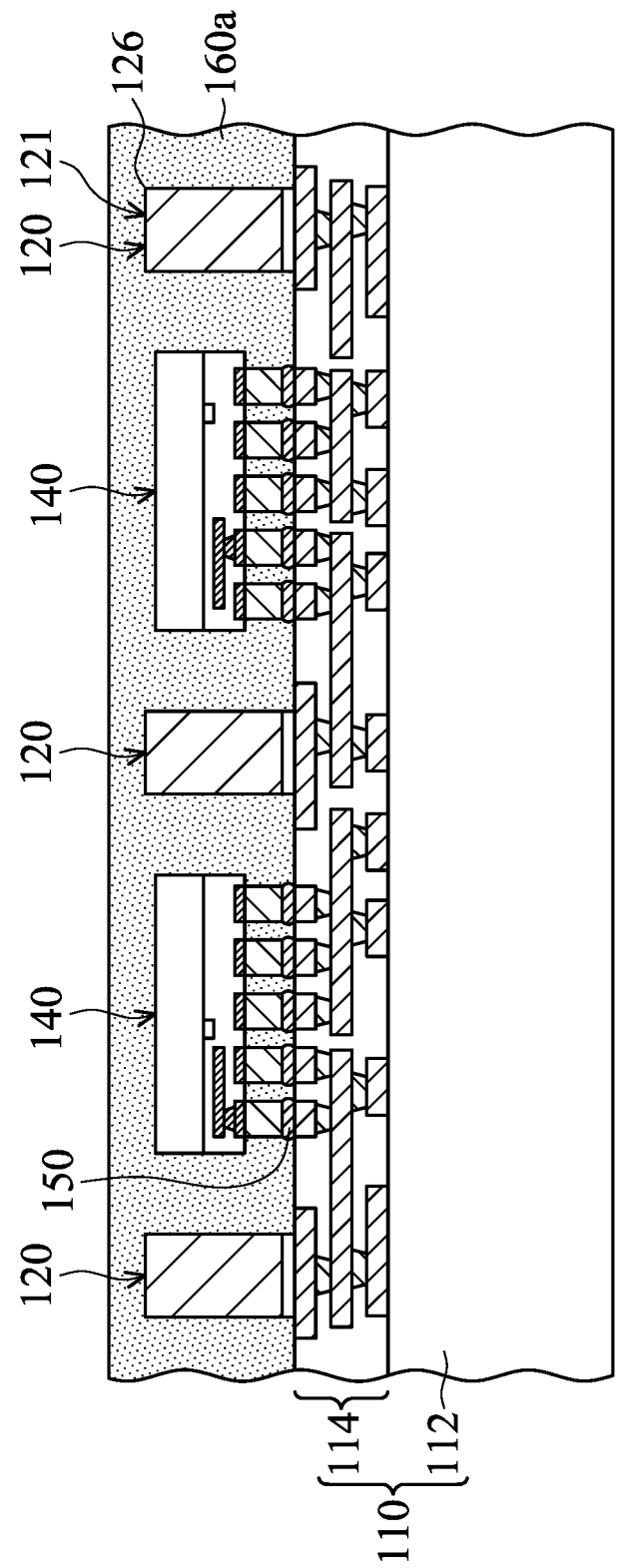
FIGS. 2A-2E are cross-sectional views of various stages of a process for forming a chip package structure, in accordance with some embodiments.

FIGS. 2A-2E are cross-sectional views of various stages of a process for forming a chip package structure, in accordance with some embodiments. As shown in FIG. 2A, after the step of FIG. 1C, a molding material layer 160a is formed over the interconnect layer 114, the chip structures 140, the conductive bumps 150, and the conductive pillars 120, in accordance with some embodiments. The molding material layer 160a surrounds the chip structures 140, the conductive bumps 150, and the conductive pillars 120, in accordance with some embodiments.

Figure 2B:
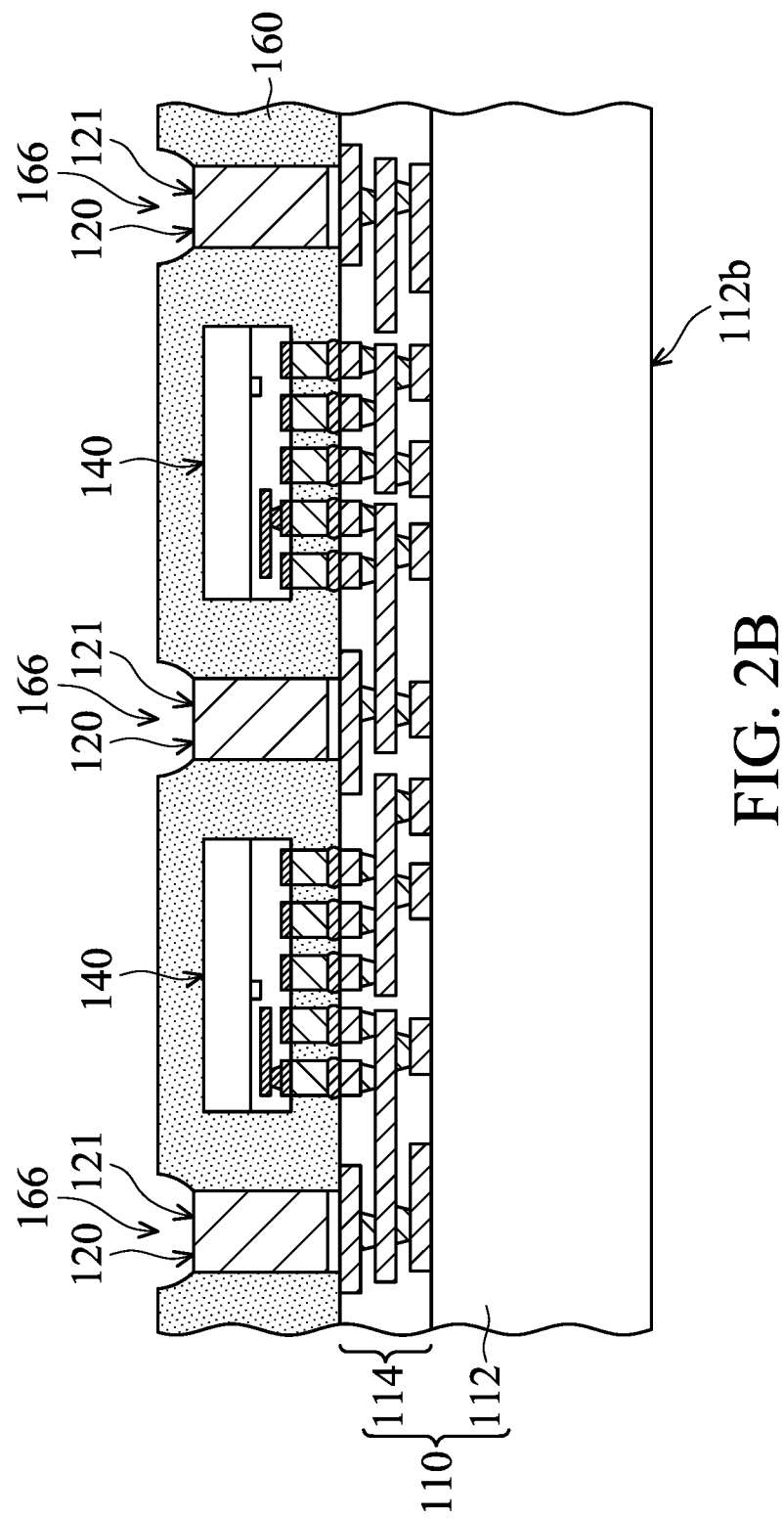

Thereafter, as shown in FIGS. 2A and 2B, portions of the molding material layer 160a over the conductive pillars 120 are removed to form recesses 166 in the molding material layer 160a, in accordance with some embodiments. After the removal process, the remaining molding material layer 160a forms a molding layer 160, in accordance with some embodiments.

The recesses 166 respectively expose the top surfaces 121 of the conductive pillars 120 thereunder, in accordance with some embodiments. The recess 166 is wider than the conductive pillar 120 thereunder, in accordance with some embodiments. The removal process includes a physical removal process, such as a laser ablation process, or an etching process, such as a dry etching process, in accordance with some embodiments.

Figure 2C:
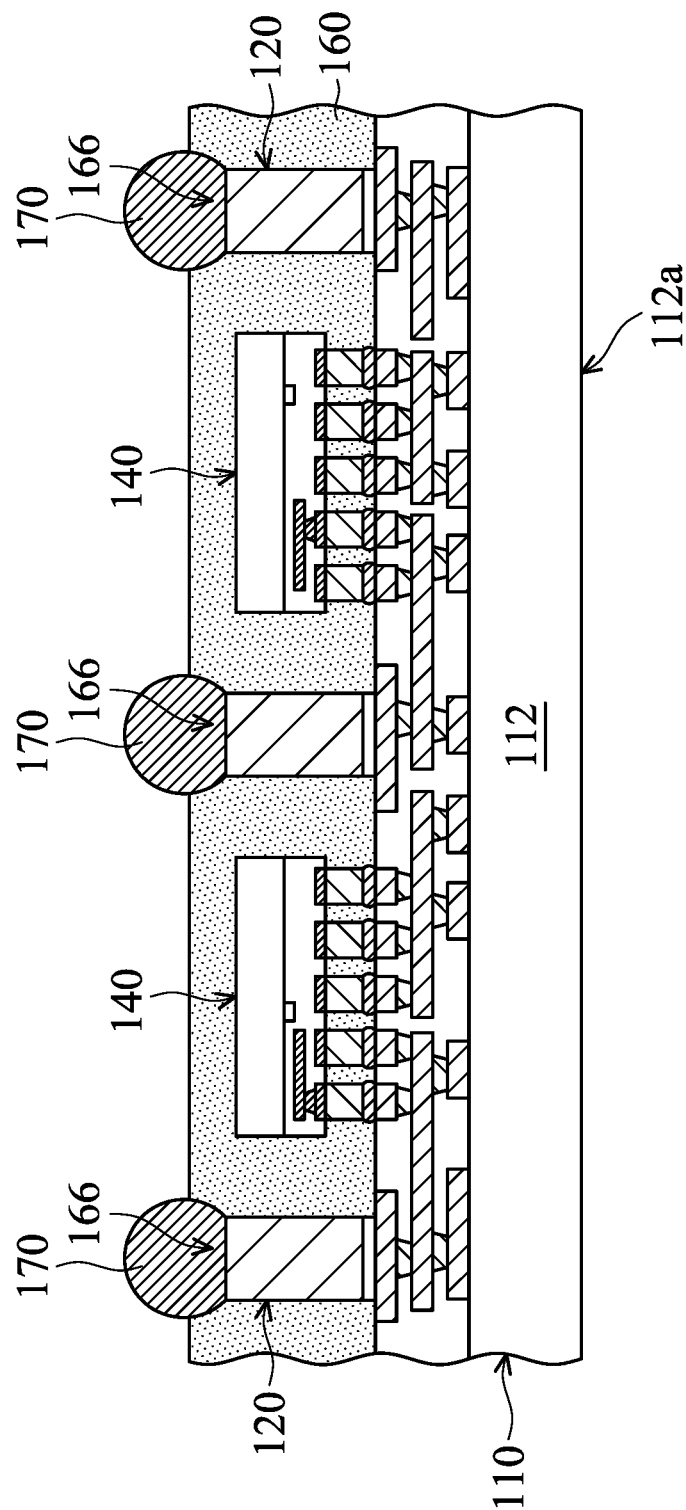

As shown in FIG. 2C, conductive bumps 170 are formed in the recesses 166, in accordance with some embodiments. The conductive bumps 170 are respectively in direct contact with the conductive pillar 120 thereunder and the molding layer 160, in accordance with some embodiments.

The conductive bumps 170 are partially embedded in the molding layer 160, in accordance with some embodiments. The conductive bumps 170 penetrate through the molding layer 160 over the conductive pillars 120, in accordance with some embodiments.

Figure 2D:
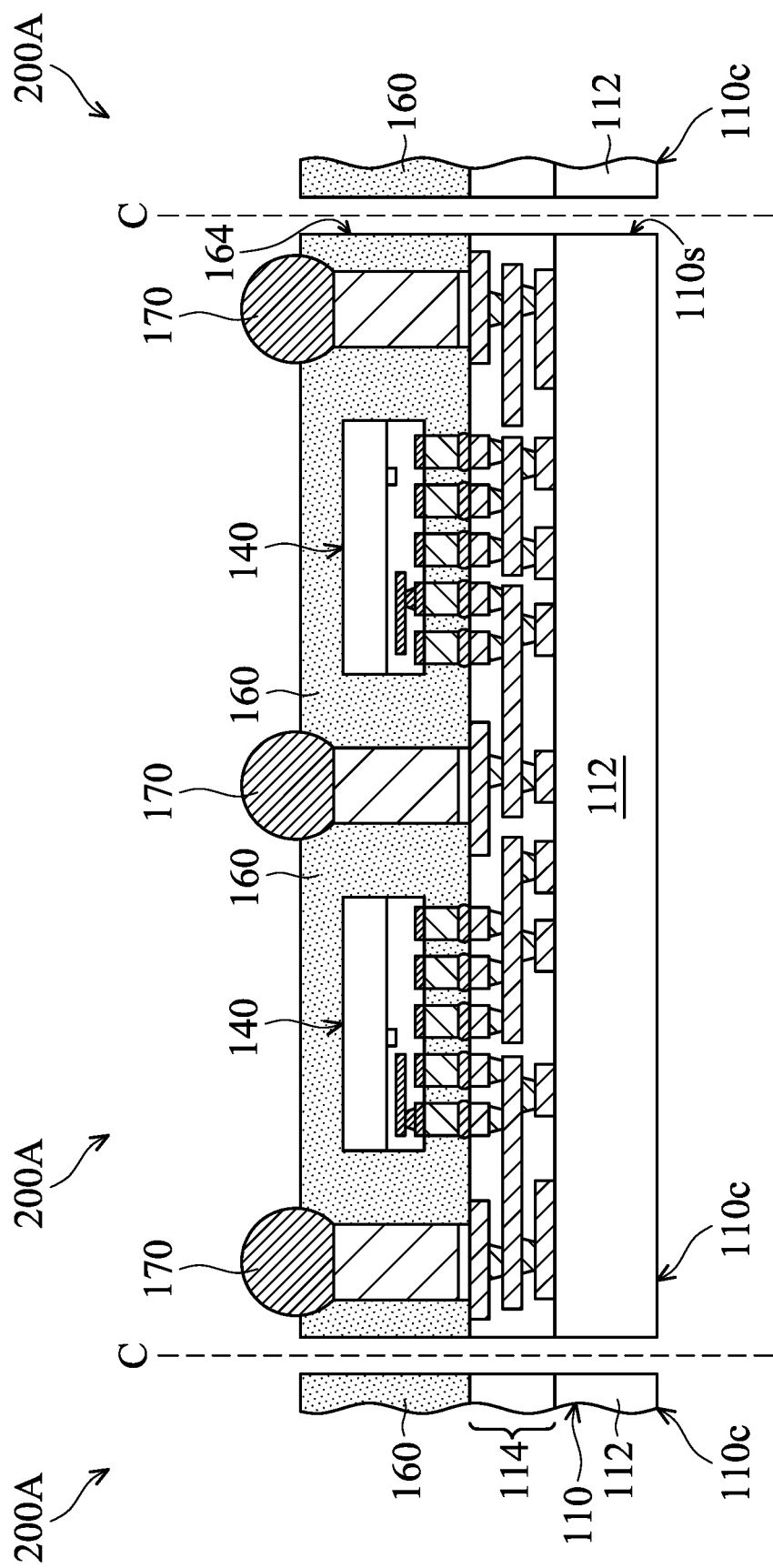

As shown in FIG. 2D, a cutting process is performed to cut through the molding layer 160 and the semiconductor structure 110 along cutting lines C so as to form chip package structures 200A, in accordance with some embodiments.

Figure 2E:
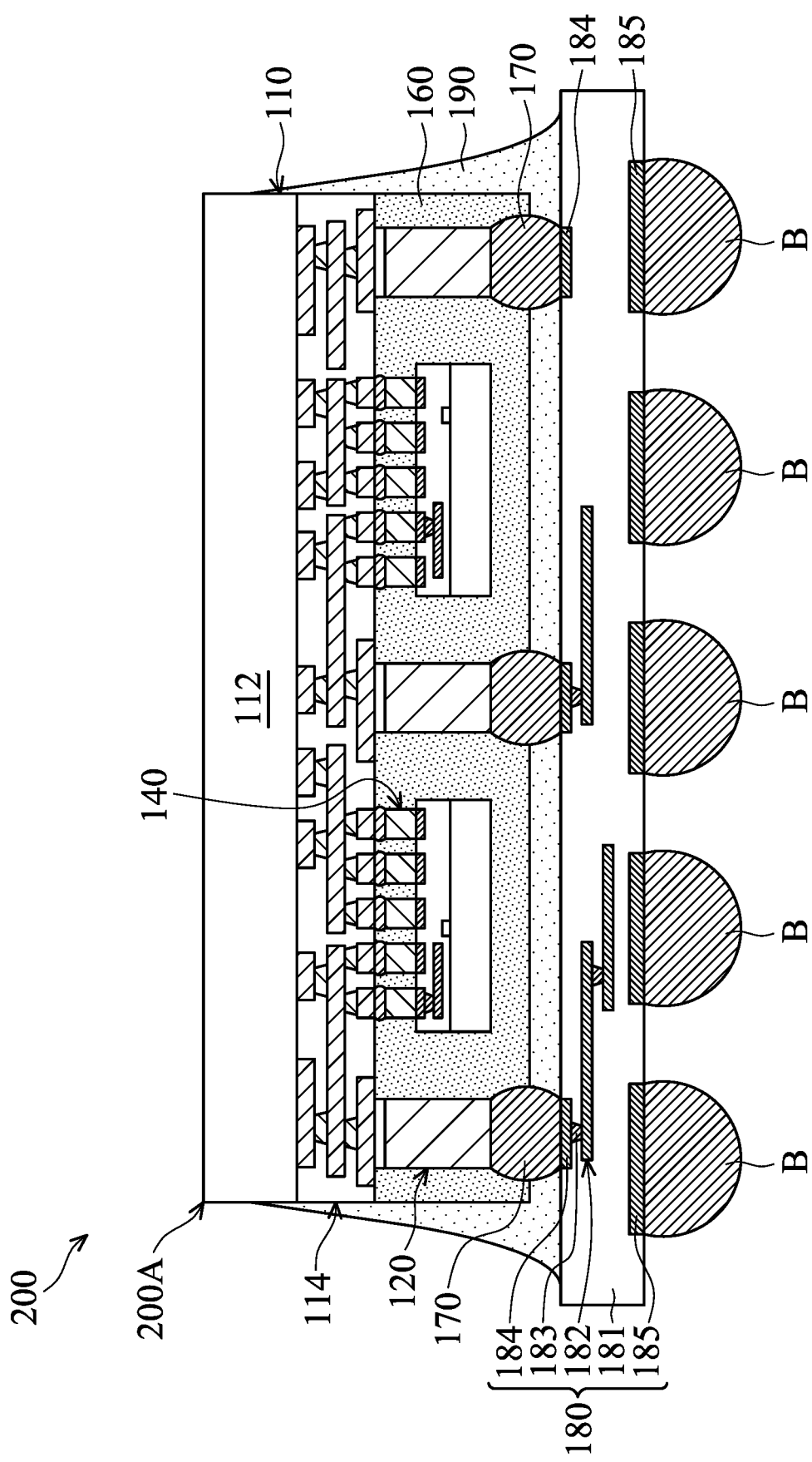

As shown in FIG. 2E, the step of FIG. 1G is performed to bond the chip package structure 200A to a wiring substrate 180 through the conductive bumps 170, to form an underfill layer 190 between the chip package structure 200A and the wiring substrate 180, and to form conductive bumps B over the conductive pads 185 of the wiring substrate 180, in accordance with some embodiments.

The conductive bumps 170 are connected between the conductive pillars 120 and the wiring substrate 180, in accordance with some embodiments. In this step, a chip package structure 200 is substantially formed, in accordance with some embodiments.

Figure 3A:
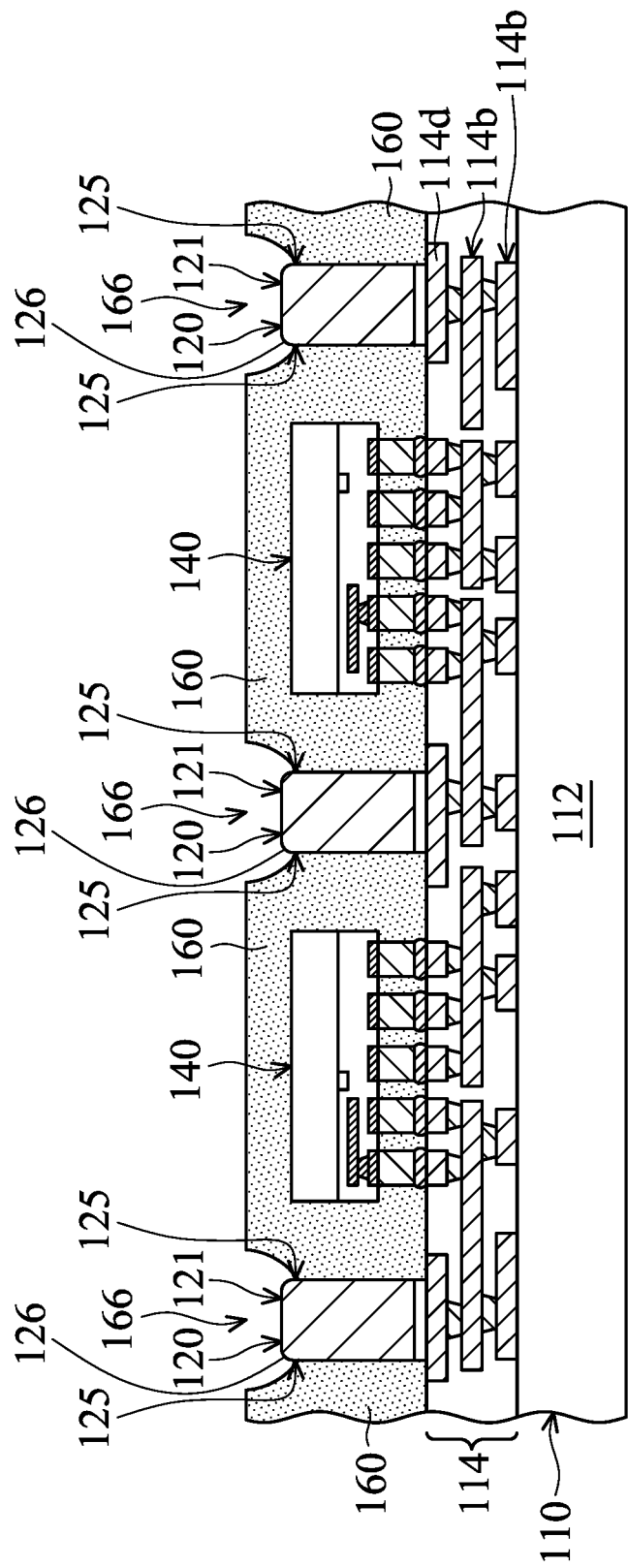
FIGS. 3A-3C are cross-sectional views of various stages of a process for forming a chip package structure, in accordance with some embodiments.
Figure 3B:
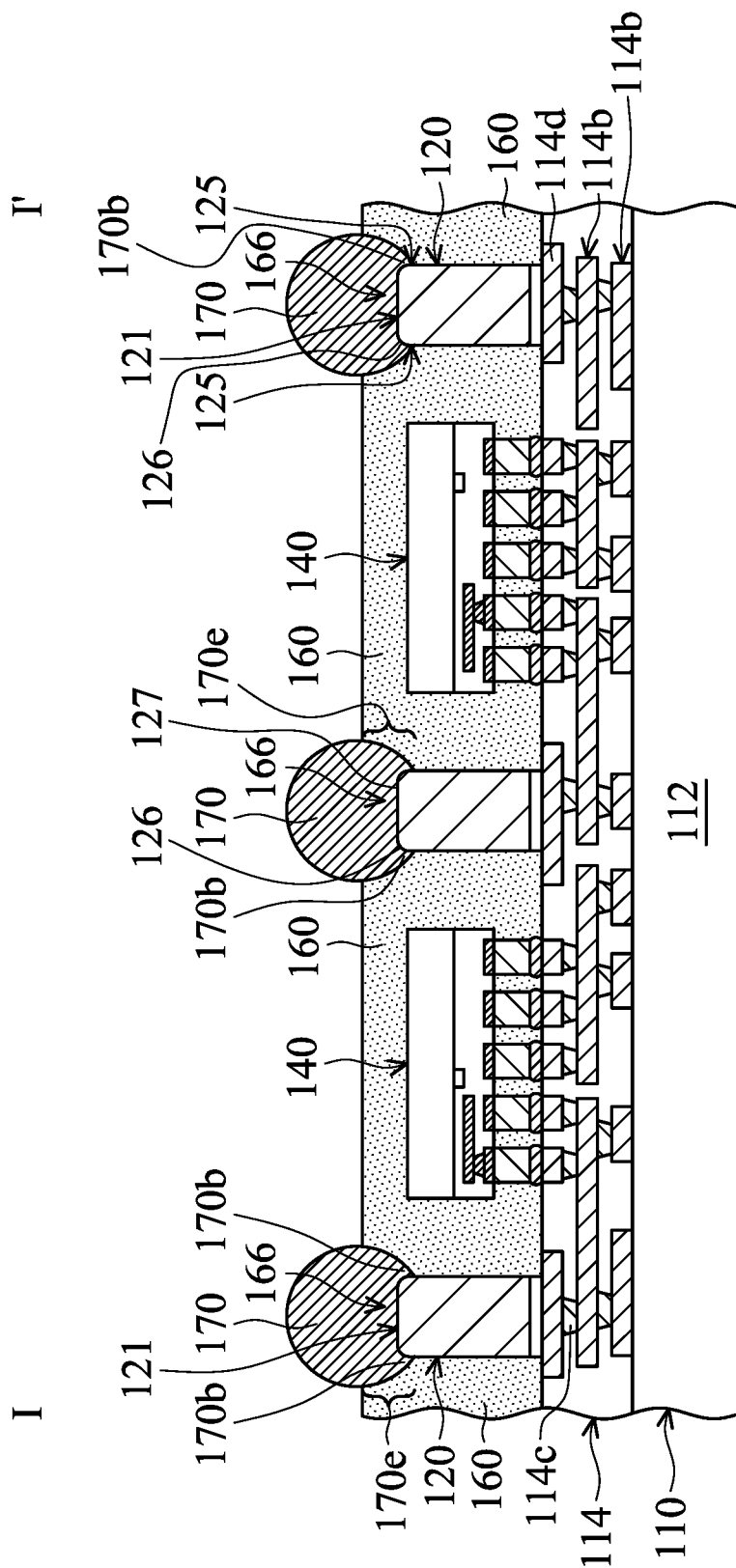
Figures 1, 3B:
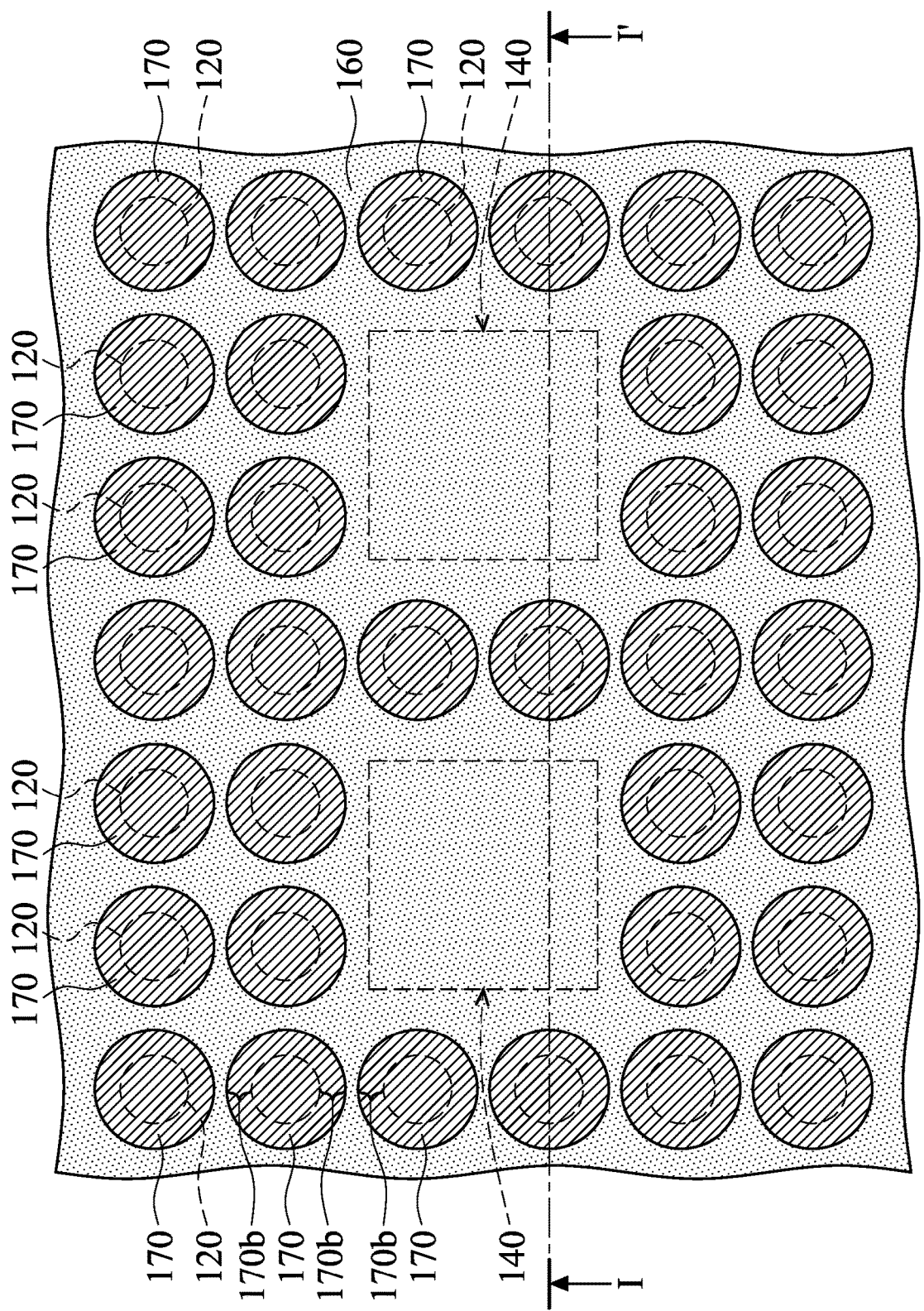
Figure 3C:
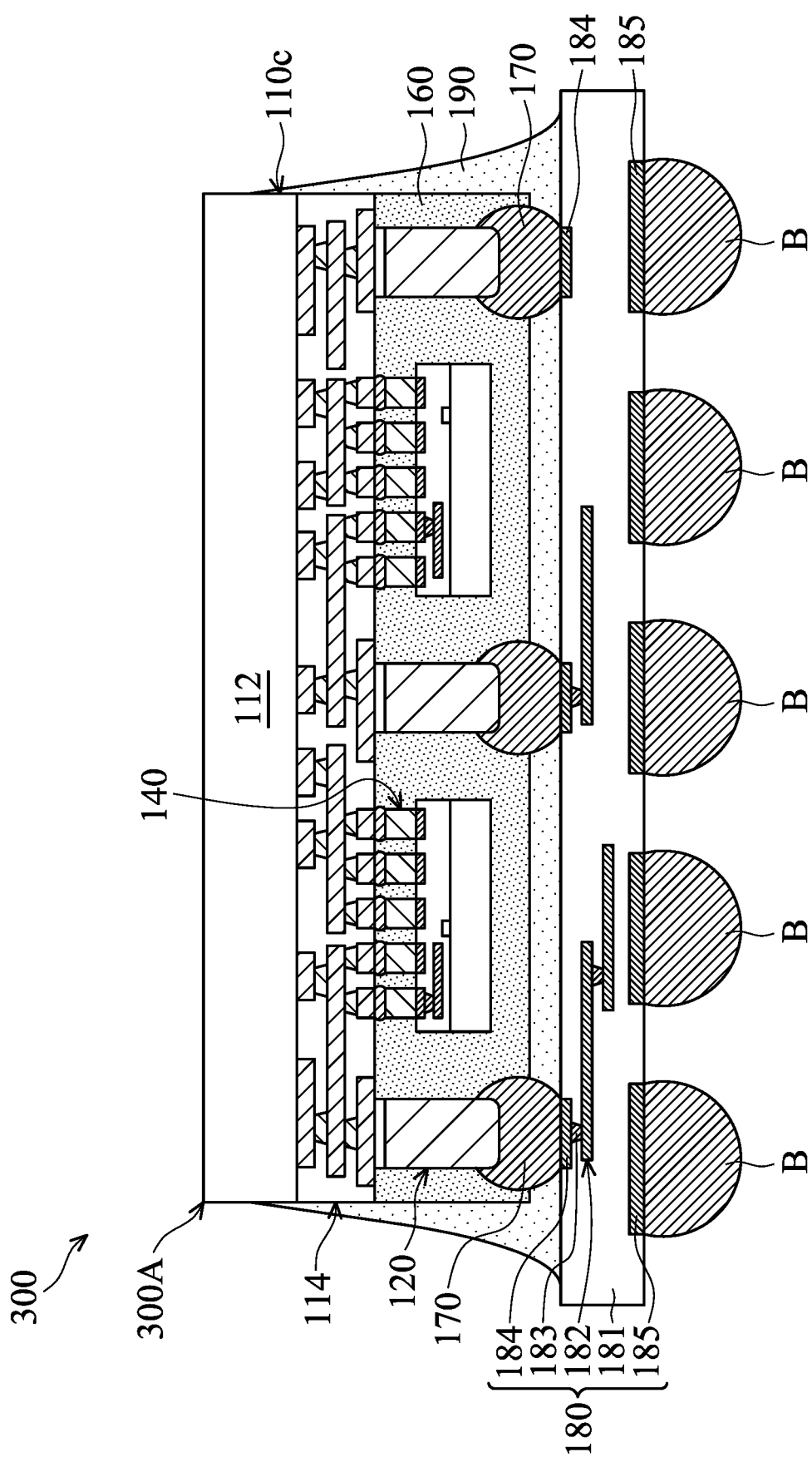

FIGS. 3A-3C are cross-sectional views of various stages of a process for forming a chip package structure, in accordance with some embodiments. As shown in FIG. 3A, after the step of FIG. 2A, portions of the molding material layer 160*a* over the conductive pillars 120 are removed to form recesses 166 in the molding material layer 160*a*, in accordance with some embodiments. After the removal process, the remaining molding material layer 160*a* forms a molding layer 160, in accordance with some embodiments.

Each recess 166 exposes a top surface 121 and sidewalls 125 of the conductive pillar 120 thereunder, in accordance with some embodiments. The sidewalls 125 surround the corresponding top surface 121, in accordance with some embodiments. The sidewalls 125 are adjacent to the top surface 121, in accordance with some embodiments. In some embodiments, corners 126 of the conductive pillar 120 are between the top surface 121 and the sidewalls 125.

As shown in FIGS. 2A and 3A, the removal process of the portions of the molding material layer 160*a* over the conductive pillars 120 also removes sharp portions of the corners 126 of the conductive pillars 120, in accordance with some embodiments. Therefore, after the removal process, the corners 126 become rounded corners, which may prevent the stress from concentrating at the corners 126, in accordance with some embodiments.

The recess 166 is wider than the conductive pillar 120 thereunder, in accordance with some embodiments. The removal process includes a physical removal process, such as a laser ablation process, or an etching process, such as a dry etching process, in accordance with some embodiments.

FIG. 3B-1 is a top view of the chip package structure of FIG. 3B, in accordance with some embodiments. FIG. 3B is a cross-sectional view illustrating the chip package structure along a sectional line I-I' in FIG. 3B-1, in accordance with some embodiments.

As shown in FIGS. 3B and 3B-1, conductive bumps 170 are respectively formed in the recesses 166, in accordance with some embodiments. Each conductive bump 170 has an embedded portion 170*e*, which is embedded in the molding layer 160, in accordance with some embodiments.

Each conductive bump 170 covers the top surface 121, the corners 126, and the sidewalls 125 of the conductive pillar 120 thereunder, in accordance with some embodiments. Each conductive bump 170 is in direct contact with the top surface 121, the corners 126, and the sidewalls 125 of the conductive pillar 120 thereunder and the molding layer 160, in accordance with some embodiments.

As shown in FIGS. 3B and 3B-1, a lower portion (or a bottom portion) 170*b* of each conductive bump 170 covers the sidewalls 125 of the corresponding conductive pillar 120, in accordance with some embodiments. The lower portion 170*b* is between the sidewalls 125 and the molding layer 160, in accordance with some embodiments. As shown in FIG. 3B-1, the lower portion 170*b* of the conductive bump 170 surrounds the corresponding conductive pillar 120, in accordance with some embodiments.

As shown in FIG. 3B, an end portion 127 of the conductive pillar 120 extends into the embedded portion 170*e* of the conductive bump 170 thereover, which increase the contact surface between the conductive pillar 120 and the conductive bump 170 thereover, in accordance with some embodiments.

Therefore, the bonding force between the conductive pillar 120 and the conductive bump 170 thereover is increased, and the contact resistance between the conductive pillar 120 and the conductive bump 170 thereover is reduced, in accordance with some embodiments.

Since the conductive bumps 170 are partially embedded in the molding layer 160 to be connected to the conductive pillars 120 thereunder, the junctions between the conductive bumps 170 and the conductive pillars 120 are surrounded by the molding layer 160 (or in the molding layer 160), in accordance with some embodiments.

The molding layer 160 protects the junctions from damage in subsequent processes, which improves the reliability of the junctions, in accordance with some embodiments. Therefore, the conductive bumps 170 are able to be connected to the conductive pillars 120 more securely, in accordance with some embodiments. The conductive bumps 170 and the conductive pillars 120 are made of different materials, in accordance with some embodiments.

As shown in FIGS. 3B and 3C, a cutting process of FIG. 2D is performed to cut through the molding layer 160 and the semiconductor structure 110 so as to form chip package structures 300A, in accordance with some embodiments. For the sake of simplicity, FIG. 3C only shows one of the chip package structures 300A, in accordance with some embodiments.

As shown in FIG. 3C, the step of FIG. 2E is performed to bond the chip package structure 300A to a wiring substrate 180 through the conductive bumps 170, to form an underfill layer 190 between the chip package structure 300A and the wiring substrate 180, and to form conductive bumps B over the conductive pads 185 of the wiring substrate 180, in accordance with some embodiments.

The conductive bumps 170 are connected between the conductive pillars 120 and the wiring substrate 180, in accordance with some embodiments. In this step, a chip package structure 300 is substantially formed, in accordance with some embodiments.

Figure 4A:
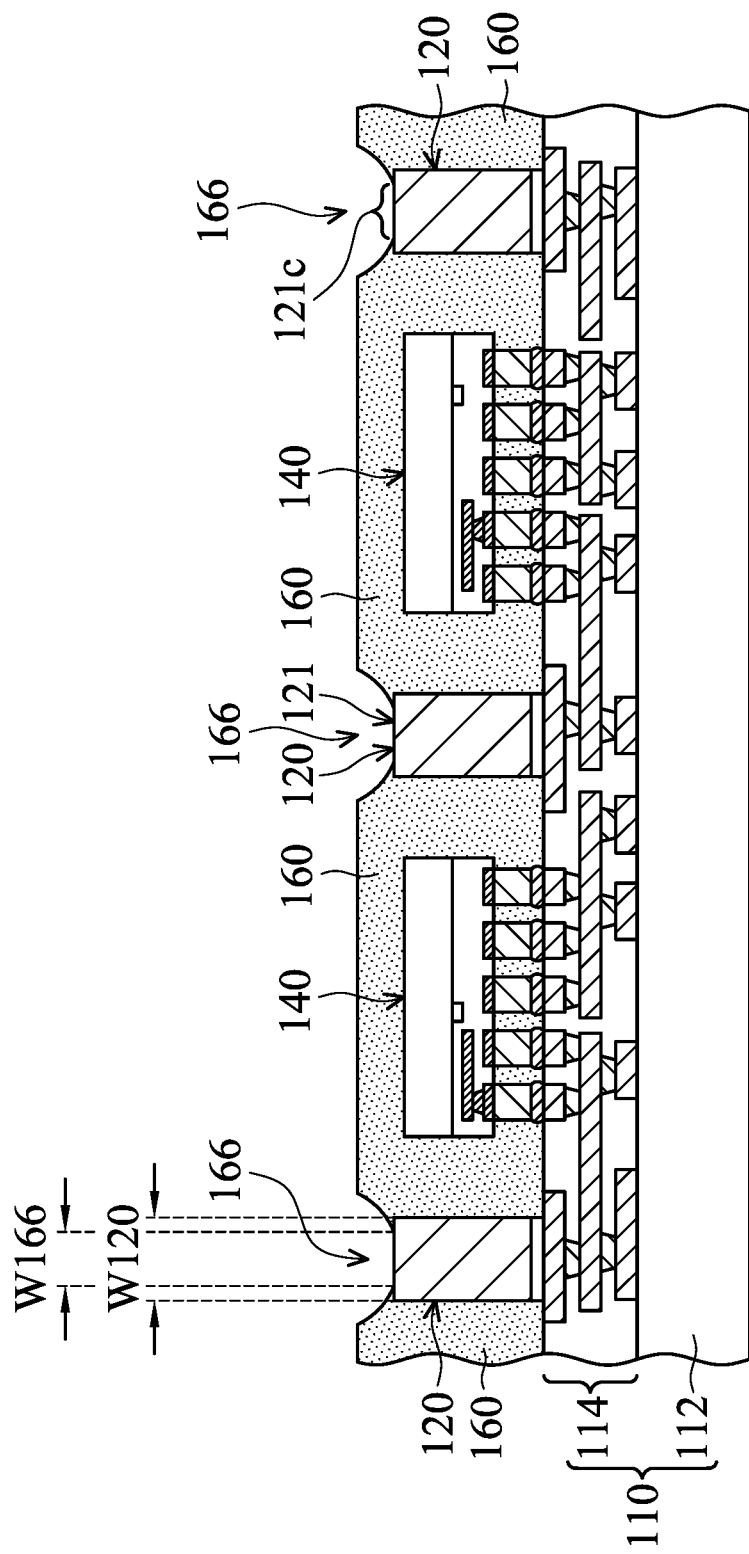
FIGS. 4A-4C are cross-sectional views of various stages of a process for forming a chip package structure, in accordance with some embodiments.
Figure 4B:
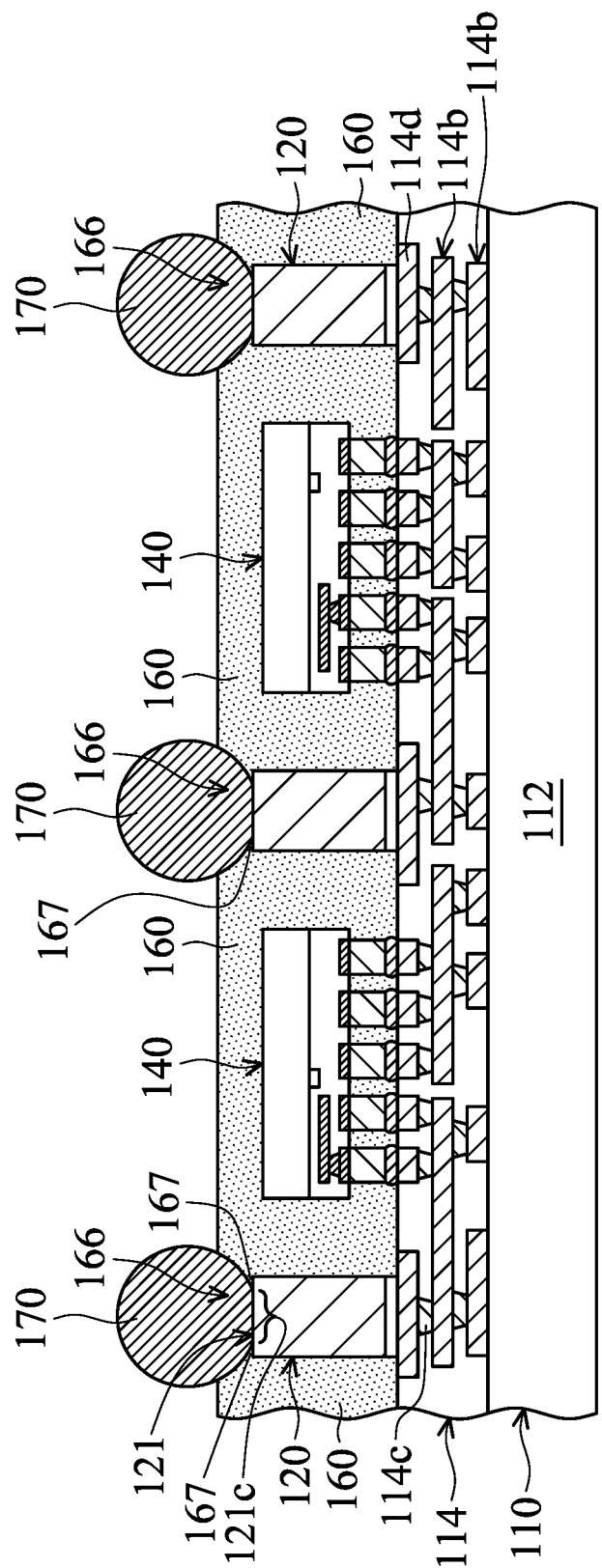
Figure 4C:
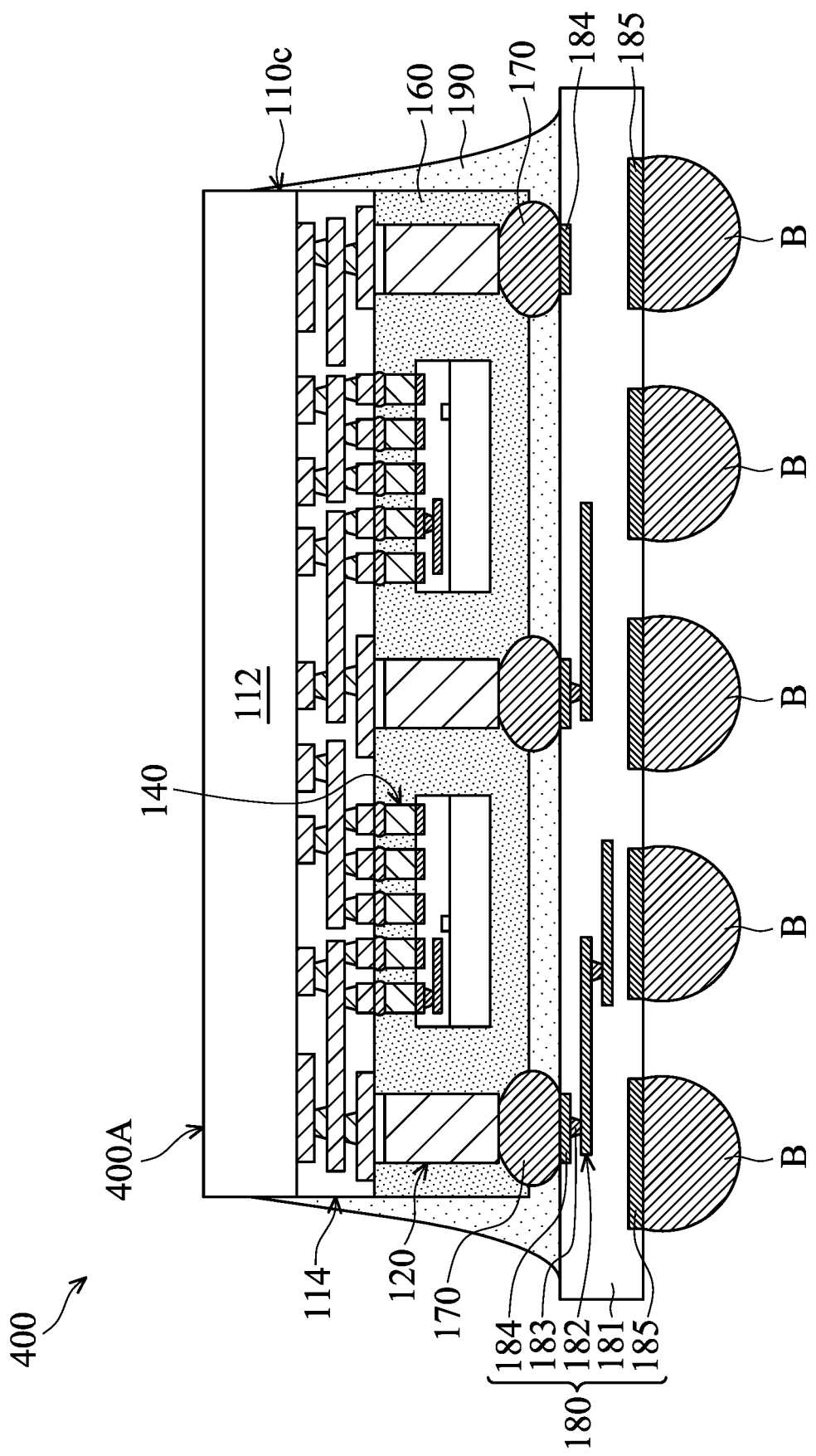

FIGS. 4A-4C are cross-sectional views of various stages of a process for forming a chip package structure, in accordance with some embodiments. As shown in FIG. 4A, after the step of FIG. 2A, portions of the molding material layer 160a over the conductive pillars 120 are removed to form recesses 166 in the molding material layer 160a, in accordance with some embodiments. After the removal process, the remaining molding material layer 160a forms a molding layer 160, in accordance with some embodiments.

Each recess 166 exposes a central portion 121c of a top surface 121 of the conductive pillar 120 thereunder, in accordance with some embodiments. The bottom width W166 of the recess 166 is less than the width W120 of the conductive pillar 120, in accordance with some embodiments.

As shown in FIG. 4B, conductive bumps 170 are respectively formed in the recesses 166, in accordance with some embodiments. The conductive bumps 170 are partially embedded in the molding layer 160, in accordance with some embodiments. The conductive bump 170 is in direct contact with the central portion 121c of the top surface 121 of the conductive pillar 120 thereunder, in accordance with some embodiments.

In some embodiments, a portion 167 of the molding layer 160 is between the conductive bump 170 and the conductive pillar 120 under the conductive bump 170. The portion 167 surrounds the conductive bump 170, in accordance with some embodiments.

The molding layer 160 is able to share the bonding stress of the conductive bumps 170 in a subsequent bonding process, which prevents the bonding stress from concentrating at the junctions of the conductive bumps 170 and the conductive pillars 120, in accordance with some embodiments.

As shown in FIGS. 4B and 4C, a cutting process of FIG. 2D is performed to cut through the molding layer 160 and the semiconductor structure 110 so as to form chip package structures 400A, in accordance with some embodiments. For the sake of simplicity, FIG. 4C only shows one of the chip package structures 400A, in accordance with some embodiments.

As shown in FIG. 4C, the step of FIG. 2E is performed to bond the chip package structure 400A to a wiring substrate 180 through the conductive bumps 170, to form an underfill layer 190 between the chip package structure 400A and the wiring substrate 180, and to form conductive bumps B over the conductive pads 185 of the wiring substrate 180, in accordance with some embodiments.

The conductive bumps 170 are connected between the conductive pillars 120 and the wiring substrate 180, in accordance with some embodiments. In this step, a chip package structure 400 is substantially formed, in accordance with some embodiments.

Figure 5A:
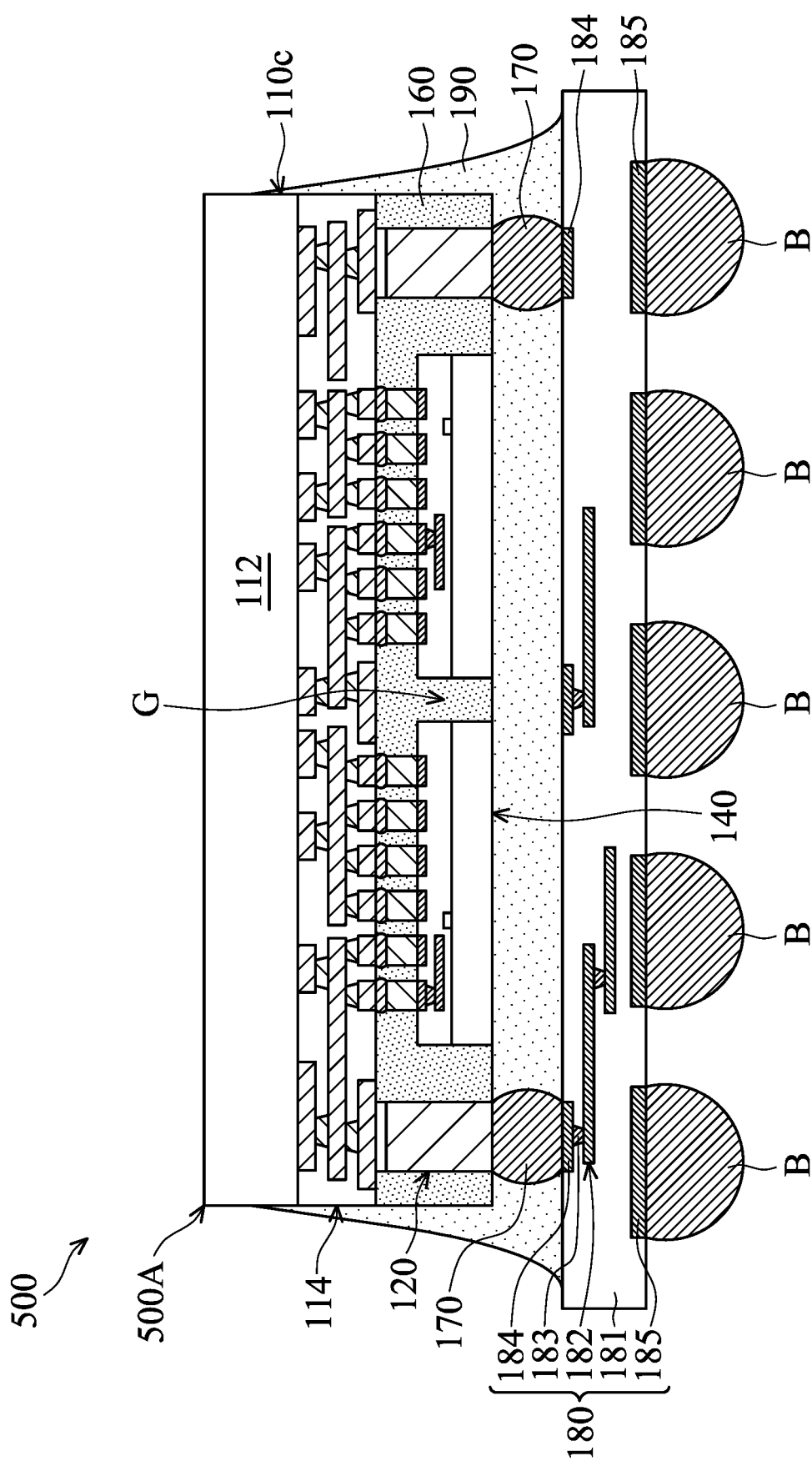
FIG. 5A is a cross-sectional view of a first chip package structure, in accordance with some embodiments.
Figure 5B:
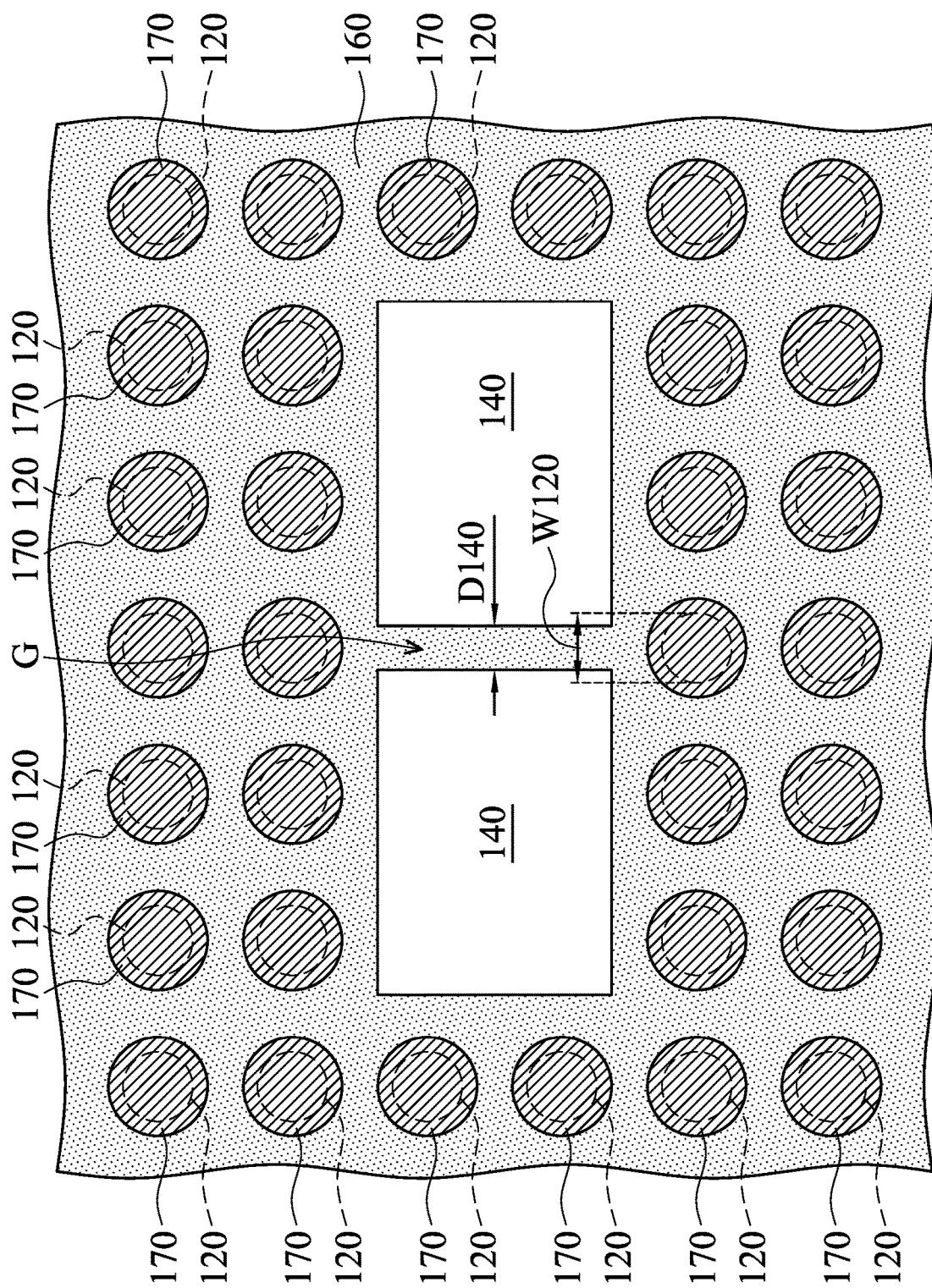
FIG. 5B is a bottom view of a second chip package structure of the first chip package structure of FIG. 5A, in accordance with some embodiments.

FIG. 5A is a cross-sectional view of a first chip package structure 500, in accordance with some embodiments. FIG. 5B is a bottom view of a second chip package structure 500A of the first chip package structure 500 of FIG. 5A, in accordance with some embodiments.

As shown in FIGS. 5A and 5B, the first chip package structure 500 is similar to the chip package structure 100 of FIG. 1G, except that the conductive pillars 120 of the first chip package structure 500 do not formed between the chip structures 140, in accordance with some embodiments.

The thermal stress tends to concentrate in the molding layer 160 between the chip structures 140 (i.e., the molding layer 160 in the gap G between the chip structures 140), which may damage the conductive pillars 120 in the gaps G, in accordance with some embodiments. Therefore, the arrangement of the conductive pillars 120 (i.e., no conductive pillar 120 in the gap G) is able to prevent the conductive pillars 120 from damage caused by the thermal stress, in accordance with some embodiments.

In some embodiments, the distance D140 between the chip structures 140 is equal to or less than a width W120 of the conductive pillar 120. The distance D140 ranges from about 20 μm to about 40 μm, in accordance with some embodiments. In some other embodiments, the distance D140 is greater than the width W120.

Processes and materials for forming the chip package structures 200, 300 and 400 and the first chip package structure 500 may be similar to, or the same as, those for forming the chip package structure 100 described above. Elements designated by the same reference numbers as those in FIGS. 1A to 5B have the structures and the materials similar thereto or the same thereas. Therefore, the detailed descriptions thereof will not be repeated herein.

In accordance with some embodiments, chip package structures and methods for forming the same are provided. The methods (for forming the chip package structure) form a first chip structure, conductive pillars, and a molding layer over a second chip structure and form conductive bumps over the conductive pillars. The first chip structure is bonded to the second chip structure in a face to face relationship, and the molding layer surrounds the first chip structure and the conductive pillars. The second chip structure is able to be bonded to a device element not only through the conductive bumps but also through the conductive pillars, and therefore the size of the conductive bumps is reduced. Therefore, the number density of the conductive bumps is improved, which improves the efficiency of signal transmission between the second chip structure and the device element.

In accordance with some embodiments, a chip package structure is provided. The chip package structure includes a first chip structure including a substrate and an interconnect layer over the substrate. The chip package structure includes a second chip structure over the interconnect layer. The chip package structure includes a first conductive bump connected between the interconnect layer and the second chip structure. The chip package structure includes a conductive pillar over the interconnect layer. The chip package structure includes a molding layer over the interconnect layer and surrounding the second chip structure, the first conductive bump, and the conductive pillar. The chip package structure includes a second conductive bump over a first surface of the conductive pillar. The first surface faces away from the first chip structure.

In accordance with some embodiments, a chip package structure is provided. The chip package structure includes a first chip structure including a first substrate and a first interconnect layer over the first substrate. The chip package structure includes a second chip structure over the first interconnect layer. The second chip structure includes a second substrate and a second interconnect layer under the second substrate, and the second interconnect layer is between the second substrate and the first interconnect layer. The chip package structure includes a conductive pillar over the first interconnect layer. The chip package structure includes a molding layer over the first interconnect layer and the second chip structure and surrounding the conductive pillar. The chip package structure includes a conductive bump partially embedded in the molding layer and connected to the conductive pillar.

In accordance with some embodiments, a method for forming a chip package structure is provided. The method includes forming a conductive pillar over a semiconductor structure. The semiconductor structure includes a substrate and an interconnect layer over the substrate, and the conductive pillar is over and connected to the interconnect layer. The method includes bonding a chip structure to the interconnect layer through a first conductive bump. The method includes forming a molding layer over the interconnect layer. The molding layer surrounds the chip structure, the first conductive bump, and the conductive pillar. The method includes forming a second conductive bump over and connected to the conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
   forming a conductive pillar over a semiconductor structure, wherein the semiconductor structure comprises a substrate and an interconnect layer over the substrate, and the conductive pillar is over and connected to the interconnect layer;
   bonding a chip structure to the interconnect layer through a first conductive bump, wherein a first thickness of the conductive pillar is substantially equal to a sum of a second thickness of the chip structure and a third thickness of the first conductive bump;
   forming a molding layer over the interconnect layer, wherein the molding layer surrounds the chip structure, the first conductive bump, and the conductive pillar; and
   forming a second conductive bump over and connected to the conductive pillar.

2. The method for forming the chip package structure as claimed in claim 1, wherein the forming of the molding layer comprises:
   forming a molding material layer over the interconnect layer, the chip structure, and the conductive pillar; and
   removing the molding material layer over the chip structure and the conductive pillar.

3. The method for forming the chip package structure as claimed in claim 2, wherein the removing of the molding material layer over the chip structure and the conductive pillar comprises:
   partially removing the conductive pillar from a first top surface of the conductive pillar.

4. The method for forming the chip package structure as claimed in claim 3, wherein the first top surface of the conductive pillar is higher than a second top surface of the chip structure before partially removing the conductive pillar, and
   the first top surface of the conductive pillar is substantially level with the second top surface of the chip structure after partially removing the conductive pillar.

5. The method for forming the chip package structure as claimed in claim 3, wherein the removing of the molding material layer over the chip structure and the conductive pillar further comprises:
   partially removing the chip structure from a second top surface of the chip structure.

6. The method for forming the chip package structure as claimed in claim 1, wherein the second conductive bump is wider than the conductive pillar.

7. A method for forming a chip package structure, comprising:
   forming a conductive pillar over a semiconductor structure, wherein the semiconductor structure comprises a substrate and an interconnect layer over the substrate, and the conductive pillar is over and connected to the interconnect layer;
   bonding a chip structure to the interconnect layer through a first conductive bump, wherein a first top surface of the conductive pillar is higher than a second top surface of the chip structure, and the first top surface and the second top surface face away from the semiconductor structure;
   forming a molding layer over the interconnect layer, the chip structure, and the conductive pillar;
   partially removing the molding layer to form a recess in the molding layer, wherein the recess exposes a top surface of the conductive pillar; and
   forming a second conductive bump in the recess and connected to the conductive pillar.

8. The method for forming the chip package structure as claimed in claim 7, wherein a portion of the second conductive bump is outside the recess.

9. The method for forming the chip package structure as claimed in claim 7, wherein the second conductive bump is in contact with the molding layer.

10. The method for forming the chip package structure as claimed in claim 7, wherein the molding layer covers the second top surface of the chip structure.

11. The method for forming the chip package structure as claimed in claim 7, wherein the second conductive bump penetrates through the molding layer.

12. The method for forming the chip package structure as claimed in claim 7, wherein a width of the recess in the molding layer decreases toward the conductive pillar.

13. A method for forming a chip package structure, comprising:
   forming a conductive pillar over a semiconductor structure, wherein the semiconductor structure comprises a first substrate and a first interconnect layer over the first substrate, and the conductive pillar is over and connected to the first interconnect layer;
   bonding a chip structure to the first interconnect layer, wherein the chip structure comprises a second substrate and a second interconnect layer between the second substrate and the first interconnect layer;
   forming a molding layer over the first interconnect layer, the chip structure, and the conductive pillar;
   partially removing the molding layer to form a recess in the molding layer, wherein the recess exposes a top surface and a sidewall of the conductive pillar; and
   forming a conductive bump in the recess, wherein a first melting point of the conductive bump is lower than a second melting point of the conductive pillar.

14. The method for forming the chip package structure as claimed in claim 13, wherein the conductive bump is in contact with the top surface and the sidewall of the conductive pillar.

15. The method for forming the chip package structure as claimed in claim 13, wherein a first top surface of the conductive pillar is higher than a second top surface of the chip structure.

16. The method for forming the chip package structure as claimed in claim 13, wherein the conductive pillar has a rounded corner between the top surface and the sidewall, and the recess exposes the rounded corner.

17. The method for forming the chip package structure as claimed in claim 16, wherein the conductive bump wraps around the rounded corner of the conductive pillar.

18. The method for forming the chip package structure as claimed in claim 13, wherein the recess has a curved inner wall.

19. The method for forming the chip package structure as claimed in claim 18, wherein the conductive bump is in contact with the curved inner wall.

20. The method for forming the chip package structure as claimed in claim 13, wherein a top portion of the conductive pillar is embedded in the conductive bump after the conductive bump is formed in the recess.

* * * * *